US007304486B2

(12) United States Patent
Petersen et al.

(10) Patent No.: US 7,304,486 B2
(45) Date of Patent: Dec. 4, 2007

(54) NANO-DRIVE FOR HIGH RESOLUTION POSITIONING AND FOR POSITIONING OF A MULTI-POINT PROBE

(75) Inventors: Christian Leth Petersen, Virum (DK); Ulrich Quaade, Bagsværd (DK); Peter Folmer Nielsen, Farum (DK); Francois Grey, Copenhagen (DK); Peter Bøggild, Copenhagen (DK)

(73) Assignee: Capres A/S (DK)

( * ) Notice: Subject to any disclaimer, the term of this patent is extended or adjusted under 35 U.S.C. 154(b) by 0 days.

(21) Appl. No.: 10/098,969

(22) Filed: Mar. 14, 2002

(65) Prior Publication Data

US 2002/0153909 A1 Oct. 24, 2002

Related U.S. Application Data

(63) Continuation-in-part of application No. 09/750,645, filed on Dec. 28, 2000, now abandoned, and a continuation of application No. PCT/DK00/00513, filed on Sep. 15, 2000, which is a continuation of application No. PCT/DK99/00391, filed on Jul. 8, 1999.

(30) Foreign Application Priority Data

| Jul. 8, 1998 | (EP) | ................................. 98610023 |
| Mar. 17, 1999 | (DK) | ............................. 1999 00378 |
| Sep. 15, 1999 | (EP) | ................................. 99610052 |

(51) Int. Cl.
*G01R 1/073* (2006.01)

(52) U.S. Cl. .................................. 324/754; 324/762

(58) Field of Classification Search ................ 324/754, 324/755, 757, 758, 761, 762, 765
See application file for complete search history.

(56) References Cited

U.S. PATENT DOCUMENTS 3,984,620 A * 10/1976 Robillard et al. .......... 174/52.4

(Continued)

FOREIGN PATENT DOCUMENTS

DE 196 48 475 6/1997

(Continued)

OTHER PUBLICATIONS

Fujii, et al., "Micropattern measurement with an atomic force microscope", *Journal of Vacuum Science & Technology: Part B*, vol. 9, No. 2, pp. 666-669 (Mar./Apr. 1991).

(Continued)

*Primary Examiner*—Ernest Karlsen
(74) *Attorney, Agent, or Firm*—Altera Law Group, LLC

(57) ABSTRACT

The multi-point probe comprises a supporting body defining a first surface, a first multitude of conductive probe arms each of the probe arms defining a proximal end and a distal end being positioned in co-planar relationship with the first surface of the supporting body. The probe arms are connected to the supporting body at the proximal ends thereof and have the distal ends freely extending from the supporting body, giving individually flexible motion to the first multitude of probe arms. The probe arms originate from a process of producing the probe arms on a wafer body in facial contact with the wafer body and removal of a part of the wafer body providing the supporting body and providing the probe arms freely extending therefrom. The multi-point probe further comprises a third multitude of tip elements extending from the distal end of the first multitude of probe arms. The tip elements originate from a process of metallization of electron beam depositions on the probe arms at the distal ends thereof.

6 Claims, 15 Drawing Sheets

U.S. PATENT DOCUMENTS

| | | | | |
|---|---|---|---|---|
| 4,329,642 | A * | 5/1982 | Luthi et al. | 324/755 |
| 4,520,314 | A * | 5/1985 | Asch et al. | 324/762 |
| 5,229,679 | A * | 7/1993 | Higuchi et al. | 310/328 |
| 5,260,926 | A * | 11/1993 | Kuroda et al. | 369/100 |
| 5,321,997 | A | 6/1994 | Carty | |
| 5,347,226 | A | 9/1994 | Bachmann et al. | |
| 5,475,318 | A | 12/1995 | Marcus et al. | |
| 5,521,518 | A * | 5/1996 | Higgins | 324/754 |
| 5,526,334 | A * | 6/1996 | Yamano et al. | 369/53.44 |
| 5,540,958 | A | 7/1996 | Bothra et al. | |
| 5,557,214 | A | 9/1996 | Barnett | |
| 5,568,004 | A | 10/1996 | Kleindiek | |
| 5,610,898 | A * | 3/1997 | Takimoto et al. | 369/126 |
| 5,621,333 | A * | 4/1997 | Long et al. | 324/762 |
| 5,778,134 | A * | 7/1998 | Sakai et al. | 386/46 |
| 5,831,961 | A * | 11/1998 | Sakai et al. | 369/126 |
| 5,900,738 | A * | 5/1999 | Khandros et al. | 324/761 |
| 6,072,190 | A | 6/2000 | Watanabe et al. | 257/48 |
| 6,174,744 | B1 | 1/2001 | Watanabe et al. | 438/14 |
| 6,482,013 | B2 * | 11/2002 | Eldridge et al. | 439/66 |
| 6,787,768 | B1 * | 9/2004 | Kley et al. | 250/306 |

FOREIGN PATENT DOCUMENTS

| | | |
|---|---|---|
| EP | 0 078 339 | 5/1983 |
| EP | 0 299 875 | 1/1989 |
| EP | 0 466 274 | 1/1992 |
| EP | 0 974 845 | 1/2000 |
| JP | 01147374 | 6/1989 |
| JP | 07199219 | 8/1995 |
| JP | 8-15318 | 1/1996 |
| JP | 8015318 A2 | 1/1996 |
| WO | WO 86/06495 | 11/1986 |
| WO | WO 94/11745 | 5/1994 |
| WO | WO 96/14959 | 5/1996 |

OTHER PUBLICATIONS

Hong, et al., "Design and Fabrication of a Monolithic High-Density Probe Card for High-Frequency On-Water Testing", *Institute of Electrical and Electronics Engineers*, pp. 289-292 (Dec. 3, 1989).

Koops, et al., "Constructive three-dimensional lithography with electron-beam induced deposition for quantum effect devices", *Journal of Vacuum Science & Technology B (Microelectronics Processing and Phenomena)*, vol. 11, No. 6, pp. 2286-2289 (Nov./Dec. 1993).

Koops, et al., "Conductive dots, wires, and supertips for field electron emitters produced by electron-beam induced deposition on samples having increased temperature", *Journal of Vacuum Science & Technology B (Microelectronics Processing and Phenomena)*, vol. 14, No. 6, pp. 4105-4109 (Nov./Dec. 1996).

Lee, et al., "High-Density Silicon Microprobe Arrays for LCD Pixel Inspection", *Institute of Electrical and Electronics Engineers*, pp. 429-434 (Feb. 11, 1996).

Niu, et al., "Double-tip scanning tunneling microscope for surface analysis", *Physical Review B*, vol. 51, No. 8, pp. 5502-5505 (Feb. 15, 1995).

Shi, et al., "New method of calculating the correction factors for the measurement of sheet resistivity of a square sample with a square four-point probe", *Rev. Sci. Instrum.*, vol. 68, No. 4, pp. 1814-1817 (Apr. 1997).

Smits, "Measurement of Sheet Resistivities with the Four-Point Probe", *The Bell System Technical Journal*, vol. 37, pp. 711-718 (May 1958).

International Search Report for PCT/DK/00513.

* cited by examiner

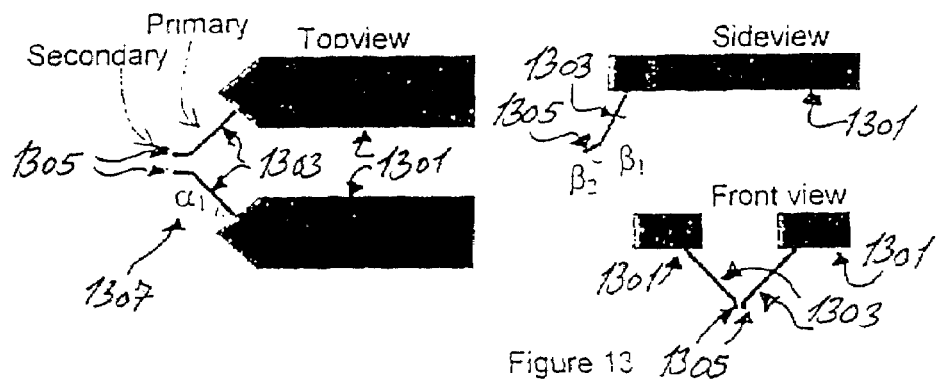
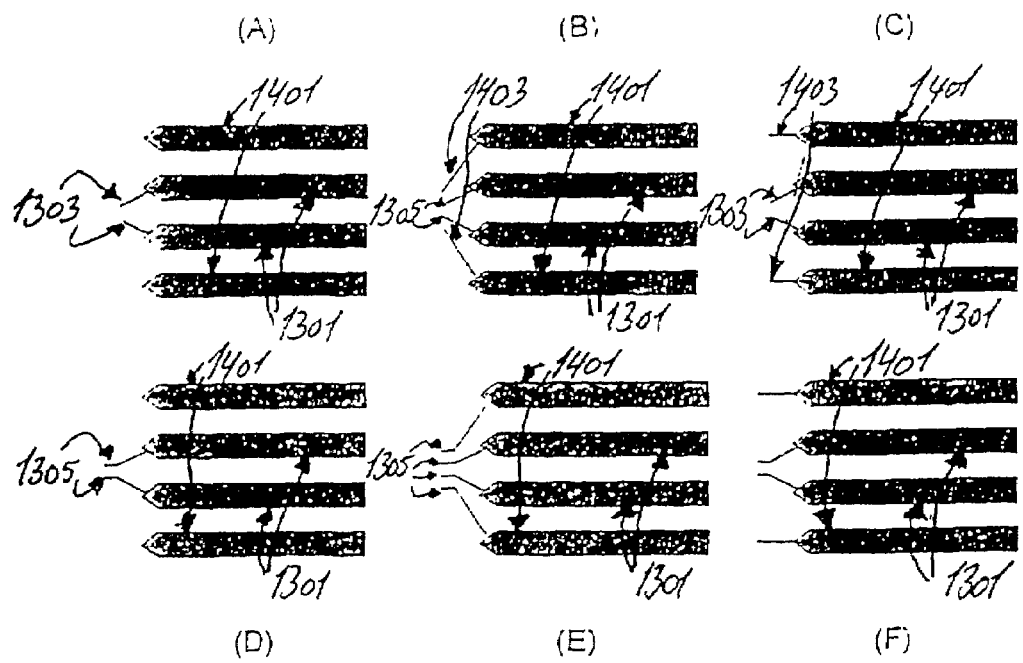
Figure 14

NANO-DRIVE FOR HIGH RESOLUTION POSITIONING AND FOR POSITIONING OF A MULTI-POINT PROBE

This application is a continuation of international application Ser. No. PCT/DK00/00513, filed 15 Sep. 2000 and a Continuation-In-Part of U.S. application Ser. No. 09/750,645, filed on 28 Dec. 2000 now abandoned, which is a continuation of PCT/DK99/00391 filed on 8 Jul. 1999.

FIELD OF THE INVENTION

The present invention generally relates to a nano-drive for high resolution positioning and for positioning of a multi-point probe and further relates to the technique of testing electric properties on a specific location of a test sample and in particular the technique of probing and analyzing semiconductor integrated circuits for example of LSI and VLSI complexity.

DESCRIPTION OF THE RELATED ART

A method for creating very small movements by means of inertial force is known from the literature, for example U.S. Pat. No. 5,229,679. This method will now be described referring to FIG. 17.

An apparatus for creating very small movements according to prior art, comprises a support 1701, a movable part 1703, a piezoelectric element 1705 and an inertial part 1707. The movable part 1703 is held against the support 1701 by means of gravitation or a spring-load. The piezoelectric element can be contracted or elongated by applying an electrical field to the element. If the contraction or elongation occur slowly, the frictional force between the support and the movable part will prevent any movement of the movable part. However, when the electrical field on the movable part changes in such a way that the piezoelectric element contract or elongates quickly, the force on the movable part can exceed the frictional force between the movable part and the substrate, causing the movable part to change its position relative to the substrate with a fraction of a micrometer. In this way a slow contraction followed by a quick elongation will cause the movable part to change position. This is shown in FIG. 17a-c. By repeated slow contraction and quick elongation of the element, the movable part can travel over several millimeters. The movable part can be made to travel in the opposite direction by repeated quick contraction and slow elongation of the piezoelectric element as shown in FIG. 17d-f.

In the prior art, only the change in length of the piezoelectric element in the direction of movement is used to create the movement of the movable part. The time dependence of the electrical field on the piezoelectric element for providing the movement is described in the literature as a saw-tooth curve-form (for example U.S. Pat. No. 5,568,004).

In the prior art, all realizations of the known motion principle use the moving part 1703 to move a body fixed to said part relative to another body which is fixed to the underlying support 1701. Furthermore, in all existing realizations of the known motion principle the frictional forces are induced by outer forces such as gravitational forces, electro-mechanical forces, or external spring-loads in a highly asymmetrical manner.

The most commonly used technique of testing the electric properties of a test sample involves the generation of resistivity or carrier concentration profiles of the surface of a processed semiconductor wafer by the utilisation of a four-point probe as described in published international patent application WO 94/11745. Furthermore, see for example S. M. Sze, Semiconductor devices—Physics and Technology, Wiley N.Y. (1985).

As shown generally in FIG. 1, the conventional four-point probe technique typically has the points positioned in an in-line configuration. By applying a current to the two peripheral points as shown in detail in FIG. 2, a voltage can be measured between the two inner points of the four point probe. Thus the electric resistivity of the test sample can be determined through the equation $$p = c \cdot (V/I),$$

wherein V is voltage measured between inner points, wherein I is current applied to the peripheral points and, wherein c is a geometry factor depending on the surface contact separation d and the dimensions of the test sample. Several schemes for calculating the correction factors have been developed, see F. M. Smits, *Measurement of Sheet Resistivities with the Four-Point Probe*, Bell System Technical J. 37, 711 (1958), EP 0 299 875 B1. and J. Shi and Y. Sun, *New method for calculation of the correction factors for the measurement of sheet resistivity of a square sample with a square four-point probe*, Rev. Sci. Instrum. 68 1814 (1997).

The four-point probe generally consists of four tungsten or solid tungsten carbide tips positioned into contact with a test sample, being for example a semiconductor wafer. An external positioning system places the four-point probe into physical contact with the semiconductor wafer by moving the four-point probe in a perpendicular motion relative to the wafer surface. Pressure perpendicular to the wafer surface has to be applied to the four-point probe, in order to ensure that all four points obtain physical contact with for example an uneven wafer surface. Hence the pressure from the tips on the surface varies between the tips. The tips are separated by a distance d, shown in FIG. 1, typically in the order of 0.5 mm.

An alternative to the above described four-point probe is the SR (Spreading Resistance) probe, described in U.S. Pat. No. 5,347,226 and hereby incorporated in this description by reference. The SR probe consists of two probe tips situated on one cantilever arm , The SR probe is brought into physical contact with wafer surface by an external positioning system, while monitoring the applied pressure such as to accurately control the physical contact to the uneven surface of a semiconductor wafer. However, since the tips are situated on the same cantilever beam the pressure monitored while monitoring the maximum pressure may possibly leave one tip with an inferior physical contact.

Additionally, reference is made to U.S. Pat. Nos. 5,475,318, 5,540,958, 5,557,214, European patent application EP 0 466 274 and European patent application having application number EP 98610023.8, national German patent application DE 196 48 475 and national Japanese patent applications JP 07199219, JP 01147374 and JP H8-15318, which describe the general technical field relating to methods for measuring resistance and to production of measurement probes. The US patents are hereby incorporated in this description by reference. Furthermore, reference is made to Soonil Hong et al's article regarding design and fabrication of a monolithic high-density probe card for high-frequency on-wafer testing published in IEEE 1989, pg. 289-292, 7th issue, Changyeol Lee et al's article regarding high-density silicon microprobe arrays for LCD pixel inspection published in IEEE 1996, pg. 429-434, 6th issue, T. Fujii et al's article regarding micropattern measurement with an atomic force microscope published in Journal of Vacuum Science & Technology B (Microelectronics Processing and Phenomena) 1991 9th issue, pg. 666, H. W. P. Koops et al's article regarding Constructive three-dimensional lithography with electron beam induced deposition for quantum effect devices published in Journal of Vacuum Science & Technology B (Microelectronics Processing and Phenomena) 1993 11th issue, pg. 2386, H. W. Koops et al's article regarding conductive dots, wires, and supertips for field electron emitters produced by deposition on samples having increased temperature published in Journal of Vacuum Science & Technology B (Microelectronics Processing and Phenomena) 1996 14th issue, pg. 6, and Q. Niu et al's article regarding double tip scanning tunneling microscope for surface analysis published in Physics Rev. B 1995 51st issue pg. 5502.

Furthermore, apart from the above described limitations as to establishing contact with the surface of the test sample to be tested the prior art probes possess limitations as to miniaturisation of the testing technique as the probes hitherto known limit the maximum spacing between any two tips to a dimension in the order of 0.5 mm due to the production technique involving mechanical positioning and arresting of the individual testing pins or testing tips, in particular as far as the four-point probes are concerned, and as far as the SR-probes are concerned exhibit extreme complexity as far as the overall structure is concerned and also certain drawbacks as far as the utilisation of the SR-probe due to the overall structure of the SR-probe.

An object of the present invention is to provide a novel testing probe allowing the testing of electronic circuits of a smaller dimension as compared to the prior art testing technique and in particular of providing a testing probe allowing a spacing between testing pins less than 0.5 mm such as in the order of 100 nm e.g. 1 nm-1 µm or even smaller spacing.

A particular advantage of the present invention is related to the fact that the novel testing technique involving a novel multi-point probe allows the probe to be utilised for establishing a reliable contact between any testing pin or testing tip and a specific location of the test sample, as the testing probe according to the present invention includes individually bendable or flexible probe arms.

A particular feature of the present invention relates to the fact that the testing probe according to the present invention may be produced in a process compatible with the production of electronic circuits, allowing measurement electronics to be integrated on the testing probe, and allowing for tests to be performed on any device fabricated by any appropriate circuit technology involving planar technique, CMOS technique, thick-film technique or thin-film technique and also LSI and VLSI production techniques.

The above object, the above advantage and the above feature together with numerous other objects, advantages and features which will be evident from the below detailed description of a preferred embodiment of the present invention is according to a first aspect of the present invention obtained by a multi-point probe for testing electric properties on a specific location of a test sample, comprising:
  (a) a supporting body;
  (b) a first multitude of conductive probe arms positioned in co-planar relationship with surface of said supporting body, and freely extending from said supporting body, giving individually flexible motion of said first multitude of conductive probe arms; and
  (c) said conducting probe arms originating from a process of producing said multi-point probe including producing said conductive probe arms on supporting wafer body in facial contact with said supporting wafer body and removal of a part of said wafer body providing said supporting body and providing said conductive probe arms freely extending from said supporting body.

According to the basic realisation of the present invention, the multi-point probe according to the first aspect of the present invention is implemented in accordance with the technique of producing electronic circuits, in particular involving planar techniques as the probe is produced from a supporting body, originating from a wafer body on which a first multitude of conductive probe arms are produced involving deposition, accomplished by any technique known in the art, such as chemical vapour deposition (CVD), plasma enhanced CVD (PECVD), electron cyclotron resonance (ECR) or sputtering, etching or any other production technique, for example high resolution lithographic methods such as electron-beam lithography, atomic force microscopy (AFM) lithography or laser lithography, whereupon a part of the original supporting body is removed through mechanical grinding or etching producing the freely extending conducting probe arms characteristic to the present invention constituting the test pins of multi-point probes according to the first aspect of the present invention.

The above part, which is removed from the original wafer body, producing the body supporting the conductive probe arms may constitute a minor part or a major part of the original wafer body and, the supporting body may according to alternative embodiments of the multi-point probe according to the present invention dimensionally constitute a minor part or a major part as compared to the freely extending part of the conductive probe arms.

The conductive probe arms characteristic to the multi-point probe according to the first aspect of the present invention according to the basic realisation of the present invention allow the contacting of the multi-point probe in an angular positioning of the conductive probe arms in relation to the surface of the test sample to be tested as distinct from the above described four-point probe, which is moved perpendicularly in relation to the surface of the test sample. The angular orientation of the conductive probe arms of the multi-point probe allows the flexible and elastically bendable conductive probe arms to contact any specific and intentional location of the test sample and establish a reliable electrical contact with the location in question.

The technique characteristic to the present invention of establishing the contact between the multi-point probe and the test locations of the test sample by utilising an angular positioning of the conductive probe arms in relation to the test sample for contacting in a bending or flexing of the conducting probe arms prevents the probe arms from mechanically destroying or deteriorating the test sample to be tested, which may be of crucial importance in specific applications such as LSI and VLSI circuitry.

As distinct from the prior art four-point probe arm, the multi-point probe according to the present invention including a first multitude of conductive probe arms may be configured in any appropriate configuration due to the utilisation of the production technique, allowing the conducting probe arms to be orientated in any mutual orientation in relation to one another and further in relation to the supporting body for complying with specific requirements such as a specific test sample to be tested. In this context, the particular feature of the present invention, namely the possibility of utilising a production technique compatible with the techniques used for producing electronic circuits, allows the multi-point probe to be readily configured in accordance with specific requirements through the utilisation of existing CAD/CAM techniques for micro-systems. However, according to the presently preferred embodiment of the multi-point probe according to the first aspect of the present invention, the first multitude of conductive probe arms are unidirectional constituting a multitude of parallel free extensions of the supporting body.

The possibility discussed above, of configuring the multi-point probe according to the first aspect of the present invention in accordance with specific requirements and, in particular, specific configurations or geometry of the electronic circuit to be tested constituting the test sample allows the conductive probe arms to be positioned on one surface of the supporting body or, alternatively, in accordance with an alternative embodiment on two opposing surfaces of the supporting body or even on non-opposing surfaces of the supporting body e.g. on neighbouring surfaces of a cubic supporting body.

The first multitude of conductive probe arms on one surface of the multi-point probe according to the first aspect of the present invention consists of a multiple of 2, ranging from at least 2 conductive probe arms to 64 conductive probe arms, having four conductive probe arms positioned on one surface as the presently preferred embodiment. Application of a test signal to the surface of the test sample between the two peripherally positioned conductive probe arms provides a resultant test signal between the two inner conductive probe arms, including information of the electric properties of the test sample.

The first multitude of conductive probe arms of the multi-point probe according to the first aspect of the present invention have a rectangular cross section, with the dimensions defined as: width being parallel to the plane of the surface of the supporting body of the multi-point probe, depth being perpendicular to the plane of the surface of the supporting body of the multi-point probe and, length being the length of the conductive probe arms extending freely from the supporting body of the multi-point probe. The dimension ratios of the first multitude of conductive probe arms comprises ratios such as: length to width within the range 500:1 to 5:1, including ratios 50:1 and 10:1, having the ratio of 10:1 as the presently preferred embodiment, width to depth ratio within the range of 20:1 to 2:1, having the ratio of 10:1 as the presently preferred embodiment. The length of the first multitude of probe arms is in the range of 20 μm to 2 mm, having a length of 200 μm as the presently preferred embodiment. The separation of distal end-points of the conductive probe arms ranges from 1 μm to 1 mm, having 20 μm, 40 μm and 60 μm as the presently preferred embodiments. However, as previously described the dimensions of the multi-point probe according to the first aspect of the present invention varies as a function of the current state of the art in production technology and are therefore not a limitation to the present invention.

The distal ends of the first multitude of conductive probe arms comprise a variety of optional shapes in continuation of the end of the length opposing the supporting body of the multi-point probe according to the first aspect of the present invention. The continuation of the length of the freely extending conductive probe arms include shapes as pointed distal end-points, tapered distal end-points or enlarged circular, elliptic or orthogonal squared distal ends or combinations thereof. The elaboration of the distal end-points of the first multitude of the conductive probe arms allows for optimisation of measurements of electric properties of the test sample, that being resistive, capacitive or inductive electric properties of the test sample at frequencies ranging from DC to RF including frequencies in the LF range and the HF range.

The multi-point probe according to the first aspect of the present invention further comprises, in accordance with specific requirements, a second multitude of conductive electrodes situated on co-planar, elevated or undercut areas between the first multitude of conductive probe arms on the supporting body. The second multitude of conductive electrodes are suitable for active guarding of the first multitude of conductive probe arms to significantly reduce leakage resistance and, consequently, increase the measuring accuracy of the present invention.

The material of the supporting body of the multi-point probe according to the first aspect of the present invention comprises ceramic materials or semi-conducting materials such as Ge, Si or combinations thereof. Use of the semi-conducting materials Ge, Si or combinations thereof allows for the micro-fabrication technology in the manufacturing process of the multi-point probe, hence benefiting from the advantages of the micro-fabrication technology.

The conductive layer on the top surface of the first multitude of conductive probe arms and the conductive layer of the second multitude of conductive electrodes on the multi-point probe according to the first aspect of the present invention is made by conducting materials such as Au, Ag, Pt, Ni, Ta, Ti, Cr, Cu, Os, W, Mo, Ir, Pd, Cd, Re, conductive diamond, metal silicides or any combinations thereof.

Numerous other objects, advantages and features which will be evident from the below detailed description of a presently preferred embodiment of the present invention, are obtained, according to a particular aspect of the present invention, by a multi-point probe for testing electric properties on a specific location of a test sample and further comprising:

(d) a third multitude of conductive tip elements extending from said distal end of said first multitude of conductive probe arms; and (e) said conductive tip elements originating from a process of metallization of electron beam depositions on said first multitude of conductive probe arms at said distal ends thereof.

This particular aspect of the presently preferred embodiment of the present invention may provide an extremely small separation of conductive tip elements and therefor may provide a measuring tool for a wide variety of possible test samples having extremely small dimensions.

The third multitude of conductive tip elements may comprise a primary section and a secondary section, the conductive tip elements are connected to the conductive probe arms through respective primary sections thereof and the secondary sections defining free contacting ends. This may provide several optional configurations and designs of the multi-point probe.

The multi-point probe according to the particular aspect of the present invention defines a first axial direction for each of the primary sections, the first axial direction constituting an increase of the total distance between the supporting body and the free contacting ends. The axial direction of the primary section constitutes a decrease of separation between the free contacting ends of the third multitude of conductive tip elements or constitutes a decrease of separation between free contacting ends of the third multitude of conductive tip elements being adjacent. Furthermore a second axial direction is defined for each of the secondary sections, the second axial direction constituting an increase of the total distance between the supporting body and the free contacting ends. The second axial direction of the secondary section constitutes a decrease of separation between the free contacting ends of the third multitude of conductive tip elements. The secondary axial direction of the secondary section constitutes a decrease of separation between the free contacting ends of the third multitude of conductive tip elements being adjacent.

Additionally, the first axial direction of the primary sections extends in a direction parallel to the plane defined by the first surface of the supporting body or in a direction converging towards the plane defined by the second surface of the supporting body. Likewise the second axial direction of the secondary sections extend in a direction parallel to the plane defined by the first surface of the supporting body or in a direction converging towards the plane defined by the second surface of the supporting body. These design configurations provide a wide scope of possibilities for testing a wide variety of test samples.

The third multitude of conductive tip elements may be equal to the first multitude of conductive probe arms, less than the first multitude of conductive probe arms, or greater than the first multitude of conductive probe arms, the preferable application having third multitude of conductive tip elements being dividable with 2.

The third multitude of conductive tip elements have a separation of the free contacting ends of the conductive tip elements in the range of 1 nm-100 nm, preferable application having the separations of 2 nm, 5 nm, 10 nm, 20 nm, 50 nm, 100 nm.

The dimension of the conductive tip elements define an overall length as distance between the distal ends of conductive probe arms and the free contacting ends of the conductive tip elements, the overall length is in the range of 100 nm to 100 µm, the preferable application having the overall length in the ranges 500 nm to 50 µm and 1 µm to 10 µm, and define a diameter, the diameter being in the range of 10 nm to 1 µm, preferable application having the overall length in the ranges 50 nm to 500 nm.

The material utilised in producing the third multitude of conductive tip elements may mainly consist of carbon and further consist of a concentration of contaminants.

The third multitude of conductive tip elements may originate from a process of tilted electron beam deposition, a process of perpendicular electron beam deposition, or a process of a combination of tilted electron beam deposition and perpendicular electron beam deposition. The metallization of the third multitude of conductive tip elements may originate from a process of in-situ metallic deposition or a process of ex-situ metallic deposition.

The above object, the above advantage and the above feature, together with numerous other objects, advantages and features which will be evident from the below detailed description of a presently preferred embodiment of the present invention, are obtained by a second aspect of the present invention, by a method of producing a multi-point probe comprising the following steps:
  (i) producing a wafer body,
  (ii) producing a first multitude of conductive probe arms positioned in coplanar and facial relationship with said wafer body,
    (i) removing a part of said wafer body for providing said conductive probe arms freely extending from said non-removed part of said wafer body constituting a supporting body from which said conductive probe arms extend freely, and
  (ii) producing a third multitude of conductive tip elements extending from said distal end of said first multitude of conductive probe arms.

The method of producing the multi-point probe in accordance with a second aspect of the present invention may involve any relevant production technique allowing the production of the freely extending conductive probe arms extending freely in relation to the supporting body. Techniques of relevance and interest are based on semiconductor micro-fabrication technology, thick-film technique, thin-film technique or combinations thereof.

Producing the third multitude of conductive tip elements comprises following steps:
  (a) mounting of multi-point probe having said first surface of supporting body parallel to horizontal on to holding means in a microscope chamber;
  (b) selecting angles $\alpha$ and $\beta$ describing inclination of said primary section and said secondary section of said conductive tip elements;
  (c) measuring of deposition rate by focusing an electron beam in one location for 5 minutes and measuring the resulting length of a first deposition;
  (d) tilting and rotating said holding means to give a field of view of said first deposition from an viewing angle identical to angle of said electron beam showing accordance with said selected angles $\alpha$ and $\beta$;
  (e) depositing a length on one of said distal ends of said conductive probe arms;
  (f) tilting and rotating said holding means to give a field of view of position for a second deposition;
  (g) depositing said length on neighbouring said distal end of said conductive probe arms;
  (h) repeating steps c through g until separation of conductive probe arms is approximately 100 nm greater than the indented separation of conductive probe arms;
  (i) selecting an angle $\alpha 1$ describing a inclination of said secondary section;
  (j) tilting and rotating said holding means selecting $\beta=0$ and selecting an $\alpha=\alpha 1$;
  (k) extending said secondary sections in continuation of said primary sections; and
  (i) ensuring that the depositing progresses by alternating the position of the electron beam on first and second deposition.

The method of producing the multi-point probe in accordance with a second aspect of the present invention may furthermore the technique of applying a conductive layer to the third multitude of conductive tip elements extending from the distal end of the first multitude of conductive probe arms may involve metallization of the electron beam depositions.

The object of the present invention is to realize the known principle of motion in a much simpler way mechanically. Specifically, in the present invention the frictional forces are caused by intrinsic elastic forces in the moving part and the substrate. To achieve this the moving part and the substrate are machined with very high precision in diameters and surface roughness.

The advantages of the present invention over previous implementations of the known principle of motions are many:
  1. The frictional forces between the moving part and the support are independent of outer forces and thus also of the orientation relative to the surroundings.
  2. The invention has complete cylindrical symmetric thereby making it very insensitive to temperature variations.

3. The forces supporting the moving part in the invention are evenly distributed on the outer surface thereby giving a large support area which give an unparalleled mechanical stability.
4. The invention includes a minimum of moving parts.
5. The distributed area of friction between the moving part and the support constitutes a hydrodynamical seal, making the invention applicable in micro-pipette and micro-valve systems.

A second object of the invention is to provide a means for positioning a specific point in space with very high precision. For example, a microscopic probe could be attached to this point.

A third object of the invention is to provide new method of actuating the motion of the moving part using only harmonic signals. This method is easy to control electrically and extends the lifetime of the actuator.

A fourth object of the invention is to provide a micropipette apparatus which can control extremely small volumes of gas or liquid.

A fifth object of the invention is to provide a micro-valve apparatus which can control flow of gas or liquid to extreme precision.

In order to attain the foregoing objects, the present invention provides one or two inertial members fixed to the distal end of one or two electro-mechanical actuators, the actuators fixed to a movable member which is movably supported by a surrounding substrate in such a way that distributed intrinsic frictional forces exist between the movable member and the substrate. The distributed intrinsic frictional coupling between the moving member and the substrate provides a hydrodynamic seal. By applying electrical fields on the electromechanical actuators, the moving member is moved relative to the support.

The above object, the above advantage and the above feature, together with numerous other objects, advantages and features which will be evident from the below detailed description of a presently preferred embodiment of the present invention, are obtained, according to a third aspect of the present invention, by a cylindrical nano-drive for in particular driving tools with high resolution and comprising:

a supporting body defining an inner open ended cylindrical space having a first longitudinal axis and an inner cylindrical surface, a movable member defining an outer contact surface, a first mounting surface and a second mounting surface, said outer contact surface mating said inner open ended cylindrical space, said movable member being inserted into said inner open ended cylindrical space and said contacting surface of said movable member and said inner cylindrical surface of said inner open ended cylindrical space creating a sliding fit between said movable member and said supporting body, said sliding fit between said movable member and said supporting body being established along the entire area of contact between said inner cylindrical surface and said outer contact surface and being provided by said outer contact surface and said inner cylindrical surface defining therebetween a spacing of a dimension having a size at any specific area of said area of contact of no more than 1 to 5 orders of power of atomic dimensions, preferably 1 to 3, 3 to 5 or 2 to 4, an inertial body having a first proximal end and second proximal end and providing counter weight for said movable member, and an actuator defining a second longitudinal axis, a third proximal end and a fourth proximal end, said actuator being connected at said third proximal end to said first proximal end of said inertial body and said fourth proximal end of said actuator being connected to said first mounting surface of said movable member, said second longitudinal axis of said actuator being substantially parallel to said first longitudinal axis of said open ended cylindrical space, said actuator moving said movable member in said cylindrical space by contraction and extension of said actuator in a direction parallel to said first longitudinal axis.

The cylindrical nano-drive according to the third aspect of the present invention provides means for high resolution positioning and in particular positioning of a multi-point probe with a high level of accuracy.

The supporting body of the cylindrical nano-drive according to the third aspect of the present invention is constructed from chemically inert and hard materials such as carbides and nitrides and defines an overall triangular, rectangular, elliptical, conical, cubical, spherical or cylindrical outer surface or any combinations thereof, preferably the supporting body defines an overall cylindrical outer surface. The cylindrical outer surface of the supporting body defines a third longitudinal axis substantially coaxial with the first longitudinal axis and the inner open ended cylindrical space defines a circular cross sectional area having an inner diameter.

Likewise the movable member is constructed from chemically inert and hard materials such as carbides and nitrides and defines an overall triangular, rectangular, elliptic, cubical, spherical, conical or cylindrical outer shape or any combinations thereof. Preferably the movable member defines an overall solid cylindrical shape defining the first mounting surface at one end of the solid cylindrical shape and the second mounting surface at the other end of the cylindrical shape. The first and the second mounting surface define a circular area having an outer diameter substantially equal to the inner diameter of the open ended cylindrical surface, so as to provide a sliding fit between the movable member and the supporting body. The movable member defines an overall cylindrical cup shape having an outer diameter substantially equal to the inner diameter of the open ended cylindrical surface constituting a sliding fit between the movable member and the inner cylindrical surface of the supporting body. The movable member defines a bottom inner cup surface constituting the first mounting surface and a bottom outer cup surface constituting the second mounting surface and has the fourth proximal end of the actuator mounted to the first mounting surface with the second longitudinal axis of the actuator being substantially parallel to the first longitudinal axis of the open ended cylindrical space. The overall cylindrical cup shape has an inner diameter substantially equal to the outer diameter of the cylindrical surface of the supporting body constituting a sliding fit between the movable member and the cylindrical surface of the supporting body. The movable member further defines a bottom outer cup surface constituting the first mounting surface and a bottom inner cup surface constituting the second mounting surface and has the fourth proximal end of the actuator mounted to the first mounting surface with the second longitudinal axis of the actuator being substantially parallel to the first longitudinal axis of the open ended cylindrical space.

The inertial body of the nano-drive according to the third aspect of the present invention is constructed from materials such as chemically inert and hard materials such as carbides and nitrides and defines an overall cubical, conical, triangular, rectangular, elliptic, spherical or cylindrical outer shape or any combinations thereof. Preferably the inertial body defines an overall cylindrical shape having a third longitudinal axis connected at the first proximal end to the third proximal of the actuator having the third longitudinal axis and the first longitudinal axis substantially co-axial. Further the inertial body may comprise probing means for performing electric measurements.

The dimensions of the nano-drive and the probe enable the combination to perform high-resolution measurements on test samples. Additionally, the wide variety of possible geometric shapes of the cylindrical nano-drive provides ideal opportunities for customising the cylindrical nano-drive for a wide variety of implementations.

The term cylindrical is to be conceived in the mathematical sense defined as a surface generated by a line, which moves parallel to a fixed line so as to cut a fixed plane curve.

The actuator of the cylindrical nano-drive according to the third aspect of the invention defines an overall triangular, cubical, conical, rectangular, elliptic, spherical or cylindrical shape or any combinations thereof. Preferably the actuator defines an overall cylindrical shape having circular cross sectional area and is constructed from piezoelectric materials such as quartz. Furthermore the actuator longitudinally and transversely contracts and extends providing a longitudinal movement of the movable member by operating the actuator electrically, magnetically, mechanically, hydraulically or pneumatically or any combinations thereof, preferably by operating the actuator electrically.

The actuator further comprises electrodes mounted onto inner and/or outer surfaces of the actuator for operation of the actuator to longitudinally and transversely contraction and extension by applying electrical signals to the electrodes. The electrical signals are constituted by DC signals and/or AC signals such as alternating square wave signals, alternating triangularly shaped signals or sinusoidal signals or any combinations thereof. By implementing the cylindrical nano-drive according to the third aspect of the invention having actuator operating according to electrical signals in any combinations various advantages are achieved. For example the control of the cylindrical nano-drive may be varied in any desired way to form a desired movement and a desired velocity of the cylindrical nano-drive.

In a first embodiment of the cylindrical nano-drive according to the third aspect of the present invention the supporting body defining the inner cylindrical space further defines a tapered extension space section co-axially placed and communicating with the inner cylindrical space and tapering toward the first longitudinal axis leaving reduced access through an aperture to the inner cylindrical space thereby constituting a micro-pipette. This embodiment provides excellent means for removing or delivering fluids at locations where general pipettes cannot reach.

In a second embodiment of the cylindrical nano-drive according to the third aspect of the present invention the supporting body defines the inner cylindrical space in communication with an inner space comprising at least two apertures, the movable member movable into the inner space controlling passage between the at least two apertures thereby constituting a micro-valve. This embodiment provides means for controlling flow of fluids or gases in a wide variety of tubular elements.

The micro-valve and the micro-pipette may have physical dimensions allowing for usage of the micro valve in microscopic robotics or microscopic medico techniques or any other microscopic processing technology.

In a third embodiment of the cylindrical nano-drive according to the third aspect of the present invention the cylindrical nano-drive further comprises a second inertial body defining a distal end and a seventh proximal end and a second actuator defining a fifth proximal end, a sixth proximal end and a fourth longitudinal axis. The fifth proximal end of the second actuator is connected to the seventh proximal end of the second inertial body and the fifth proximal end of the second actuator is connected to the second mounting surface of the movable member. The fourth longitudinal axis of the second actuator is substantially parallel to the first longitudinal axis of the open ended cylindrical space so as to provide a substantially continuous motion of the movable member. By introducing a second actuator on the cylindrical nano-drive the movement of the movable member becomes smoother and therefor a more exact control of the positioning of the movable member is achieve. Thus providing an even better high resolution positioning means.

The above object, the above advantage and the above feature, together with numerous other objects, advantages and features which will be evident from the below detailed description of a presently preferred embodiment of the present invention, are obtained, according to a fourth aspect of the present invention, by a multi-point testing apparatus for testing electric properties on a specific location of a test sample, comprising:

(iii) means for receiving and supporting said test sample;
(iv) electric properties testing means including electric generator means for generating a test signal and electric measuring means for detecting a measuring signal;
(v) A multi-point probe, comprising:
  (a) a supporting body;
  (b) a first multitude of conductive probe arms positioned in co-planar relationship with surface of said supporting body, and freely extending from said supporting body, giving individually flexible motion of said first multitude of conductive probe arms; and
  (c) said conducting probe arms originating from a process of producing said multi-point probe including producing said conductive probe arms on supporting wafer body in facial contact with said supporting wafer body and removal of a part of said wafer body providing said supporting body and providing said conductive probe arms freely extending from said supporting body;
  (d) said multi-point probe communicating with said electric properties testing means; and
(iv) nano-driving means for reciprocating said multi-point probe relative said test sample so as to cause said conductive probe arms to be contacted with said specific location of said test sample for performing said testing of electric properties thereof.

The multi-point testing apparatus according to the fourth aspect of the present invention basically includes a multi-point probe according to the first aspect of the present invention, which multi-point probe, constituting a component of the multi-point testing apparatus according to fourth aspect of the present invention, may be implemented in accordance with any of the above features of the multi-point probe according to the first aspect of the present invention. Furthermore, the multi-point testing apparatus according to the fourth aspect of the present invention includes a cylindrical nano-drive according to the third aspect of the invention, which cylindrical nano-drive, constituting another component of the multi-point testing apparatus according to the fourth aspect of the present invention, may be implemented according to the third aspect of the present invention. Additionally the multi-point testing apparatus includes electric properties testing means for testing the test sample comprising an electric generator means providing a test signal to the surface of the test sample, that being current or voltage, pulsed signal or signals, DC or AC having sinusoidal, squared, triangled signal contents or combinations thereof, ranging from LF to RF including HF, in accordance with specific requirements such as measurements of resistance, inductance, capacitance, slew rate, unity gain bandwidth and 3 dB bandwidth. The electric properties testing means further comprises an electric measuring means providing facilities for detecting a measuring signal of the above described test signal types and frequency ranges, and providing extensive electric properties testing information and including functionalities as Fast Fourier Transformation (FFT), phase lock and real time visualisation of measured test signal. The electric properties testing means features probing means for probing of the test sample, in accordance with specific requirements, so as to perform the link between the surface of the test sample and the electric properties testing means.

The multi-point testing apparatus according to the fourth aspect of the present invention also includes nano-driving means for reciprocating and holding a multi-point probe according to the first aspect of the present invention, and positioning of the multi-point probe according to the first aspect of the present invention relative to the test sample so as to cause the conductive probe arms to obtain physical contact with a specific location on the surface of the test sample for performing the testing of the electric properties, and for recording the specific location of the multi-point probe according to the first aspect of the present invention relative to the test sample, having a resolution in the range of 1 nm to 0.1 µm in all spatial directions. An object of having full maneuverability in all spatial directions, that being co-planar to the surface of the test sample or perpendicular to the surface of the test sample, is to allow for multiple point measurements utilising one calibrated multi-point probe according to the first aspect of the present invention on a full surface of a test sample, hence avoiding inaccuracies due to a multiple of calibration discrepancies. The maneuverability includes angular movements along an axis parallel to surface of the test sample, providing an angle between the surface of the test sample and the length of the conductive probe arms on the multi-point probe according to the first aspect of the invention, thus utilising the flexibility of the conductive probe arms to insure against possible destruction or deterioration of devices on the surface of the test sample, and along an axis perpendicular to the surface of the test sample providing a 360° rotation of the multi-point probe according to the first aspect of the present invention enabling measurements on devices on the surface of the test sample having any mutual relative co-planar angular positions.

The multi-point testing apparatus according to the fourth aspect of the present invention further includes means for sensing physical contact between the surface of the test sample and the multiple of conductive probe arms of the multi-point probe according to the first aspect of the present invention insuring non-destructive testing of the test sample and hence avoiding the destruction of possible devices on the surface of the test sample.

BRIEF DESCRIPTION OF THE DRAWINGS

Additional objects and features of the present invention will be more readily apparent from the following detailed description and appended claims with taken in conjunction with the drawing, in which:

FIG. 13, shows probe geometry having tips extending from probe arms;

FIG. 14, shows general tip configurations. (a), shows 2-tip, (b), shows 4-tip having non-uniform tip spacing, (c), shows 4-tip, (d)-(f), shows (a)-(c) having secondary tips;

DETAILED DESCRIPTION OF THE PREFERRED EMBODIMENTS

A preferred embodiment is directed toward making a multi-point probe and is described with respect to FIGS. 3-6.

Figure 1:
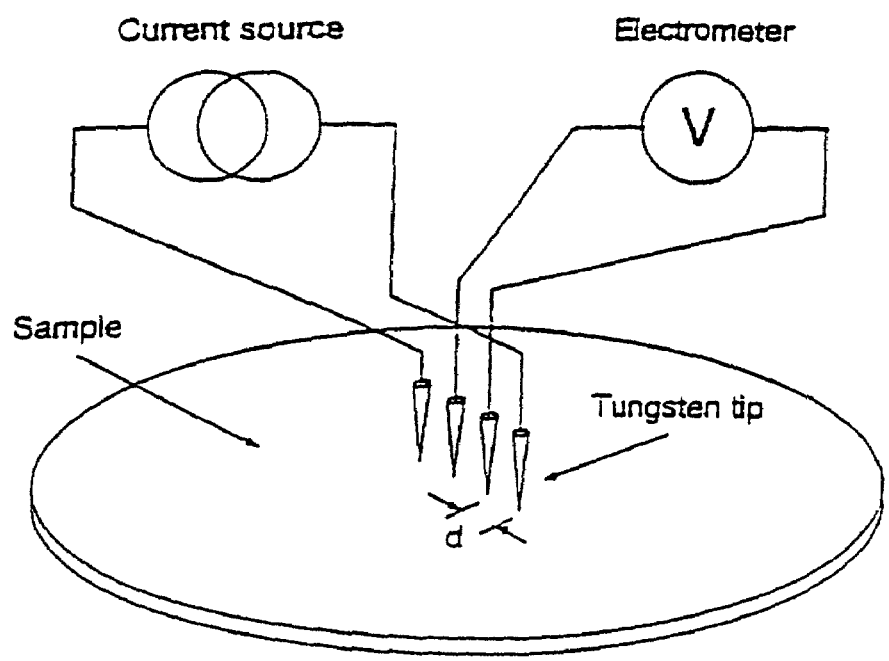
FIG. 1, provides an overall illustration of the conventional four-point probe measurement technique on a test sample.
Figure 2:
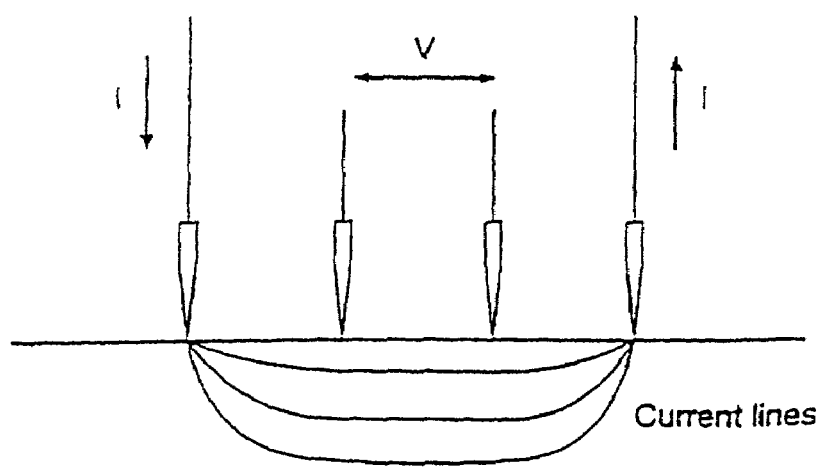
FIG. 2, shows a detailed illustration of the measurement technique depicted in FIG. 1.
Figure 3:
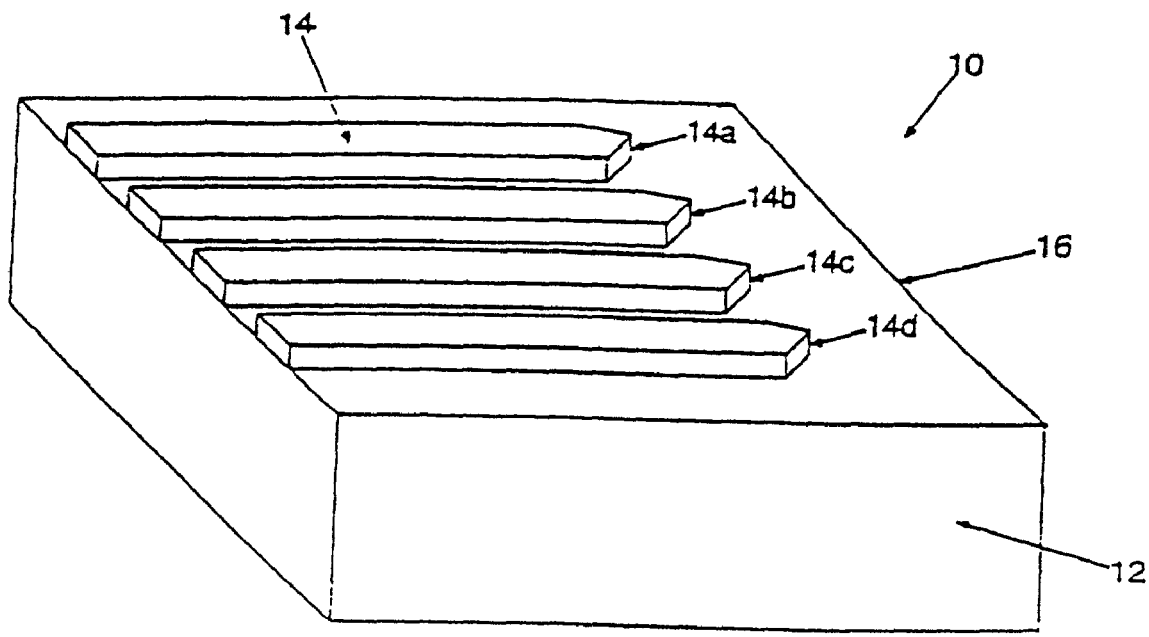
FIG. 3, depicts the substrate after patterning a deposited support layer.

FIG. 3 shows a wafer 10, for example a section of a semiconductor wafer, in intermediate state of fabrication. It shows a surface 16 of a substrate 12 covered by a support layer 14, being electrically isolating, such as silicon oxide. The deposition of the support layer 14 can be accomplished by any technique known in the art, such as chemical vapour deposition (CVD), plasma enhanced CVD (PECVD), electron cyclotron resonance (ECR) or sputtering. As shown in FIG. 3, the support layer 14 is patterned and etched to form beams with tapered end-points 14a-d. The beams are not limited to any particular form or symmetry; they can be of any geometry with suitable end-points.

The pattern is formed by forming a photoresist pattern (not shown in FIG. 3) which defines the four beams on the top surface of the support layer 14. The photoresist pattern is formed by conventional photolithographic photoresist formation, exposure, development and removal techniques. The support layer is then etched using any technique known in the art, such as dry etching or wet etching, until the unmasked parts of the support layer 14 are removed from the top surface of the substrate.

In an alternative embodiment of the present invention the four beams or part of them can be defined using high-resolution lithographic methods such as electron-beam lithography, atomic force microscopy (AFM) lithography or laser lithography.

Figure 4:
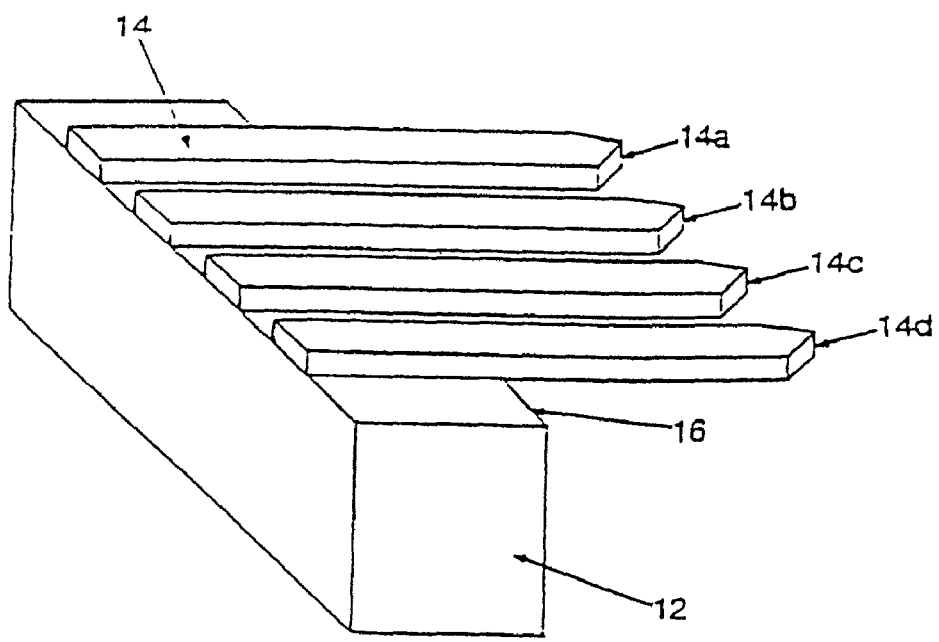
FIG. 4, illustrates the formation of the cantilevers by removal of part of the substrate.

Once the support layer has been patterned, the substrate is partially removed to release the patterned support layer, forming four cantilevers with sharpened end-points 14a-d, as illustrated in FIG. 4.

In the preferred embodiment, the substrate is removed by depositing a protective layer (not shown in FIG. 4) of silicon nitride on top and bottom surface of the substrate 12. Next, a photoresist pattern is formed on the bottom surface of the substrate by conventional photolithographic photoresist formation, exposure, development and removal techniques. The nitride layer is then removed in the unmasked areas on the bottom surface of the substrate using Reactive Ion Etch (RIE) in a plasma containing $SF_6$ and $O_2$ or similar reagents, and the substrate is etched using an etching chemistry comprising potassium hydroxide (KOH) or a similar chemistry until the freely extending probe arms are exposed. Then the protecting layer of nitride is removed from the top surface of the substrate using RIE, or using wet etching with a chemistry comprising phosphoric acid ($H_3PO_4$) or a similar chemistry.

Figure 5:
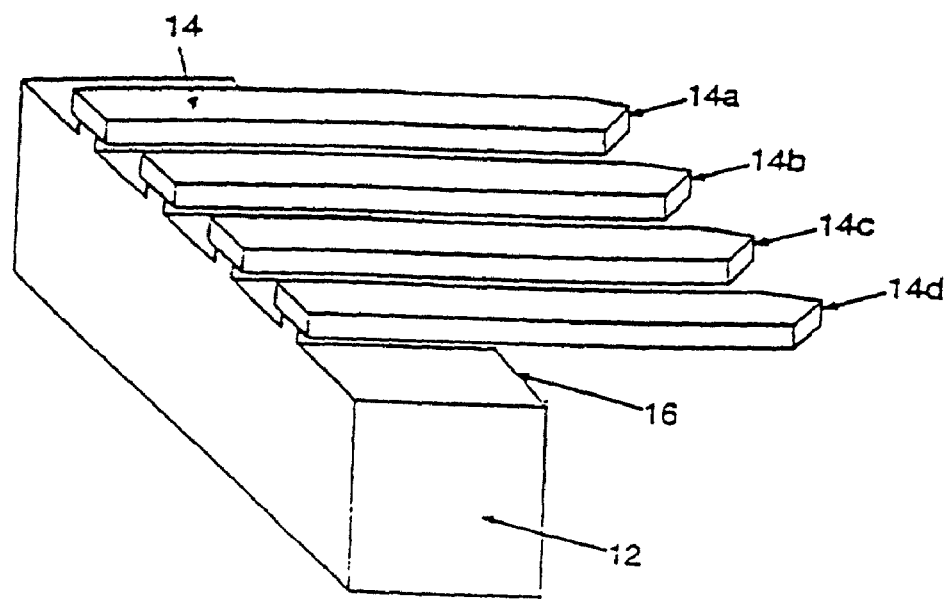
FIG. 5, depicts the etching of the substrate to undercut the pattern in the support layer.

FIG. 5, illustrates the etching of the substrate 12 to undercut the support layer 14. In the preferred embodiment, this etching step is performed with a dry etching method, such as an isotropic RIE etch.

Figure 6:
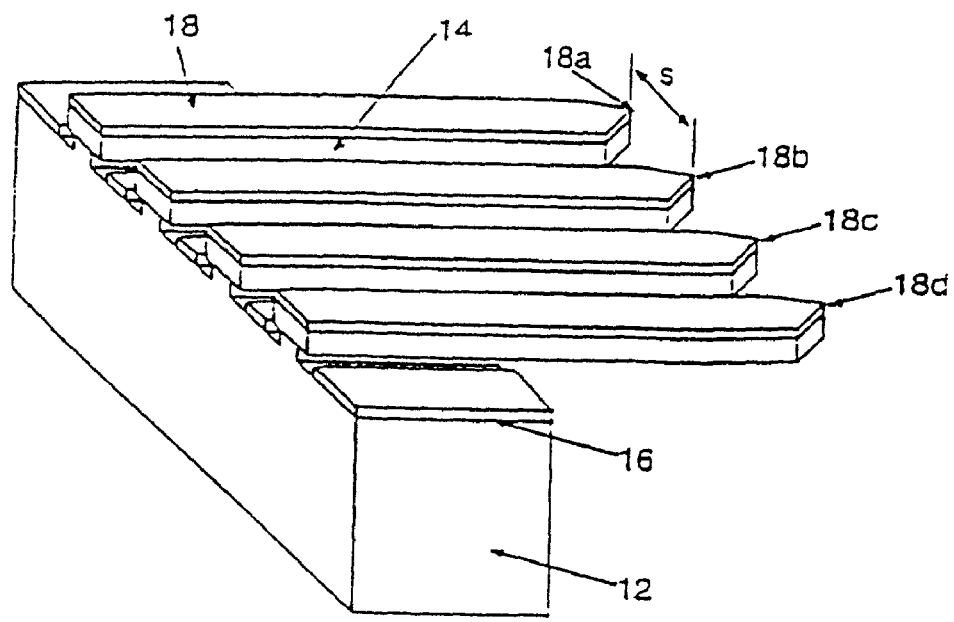
FIG. 6, depicts the deposition of an electrically conducting layer.

The final stage of fabrication is shown in FIG. 6, and involves the deposition of an electrically conducting layer 18 on the top surface of the wafer. The conducting layer is made of conducting materials like Au, Ag, Pt, Ni, Ta, Ti, Cr, Cu, Os, W, Mo, Ir, Pd, Cd, Re, conductive diamond, metal silicides or combinations thereof. Alternatively the conducting layer can be made of a highly doped semiconducting material. The conducting layer can be deposited using electron-beam evaporation, or any other similar technique known in the art. Due to the undercutting of the support layer 14, the electrically conducting layer will not create conducting paths between the four beams made in the support layer, and thus four isolated electrodes are formed on the top surface of the support beams, and thus points 18a-d can be connected through the beams to an external positioning and measuring device (not shown in FIG. 6).

As shown in FIG. 6 the deposition of the conducting layer creates electrodes on the substrate. In a preferred embodiment these electrodes are used for active guarding of the conductive probe arms to significantly reduce leakage resistance and, consequently, increase the measuring accuracy of the invention.

Referring again to FIG. 6, in the present invention the minimum probe end-point separation s is approximately 1 µm. The minimum probe end-point separation is however determined by the current state of the art in micro-fabrication technology and not any limitation of the present invention Thus, as micro-fabrication technology produces smaller and smaller devices, the minimum probe end-point separation s can also be reduced.

In operation an external positioning device places a multi-point probe made according to the present invention into physical contact with the surface of the test sample. Once electrical contact between the surface of the test sample and all four conductive probe arms has been achieved, a current is applied to two of the conductive probe arms and a corresponding voltage is measured between the two other conductive arms. The method for applying the current and detecting the voltage can be any method known in the art.

Figure 7:
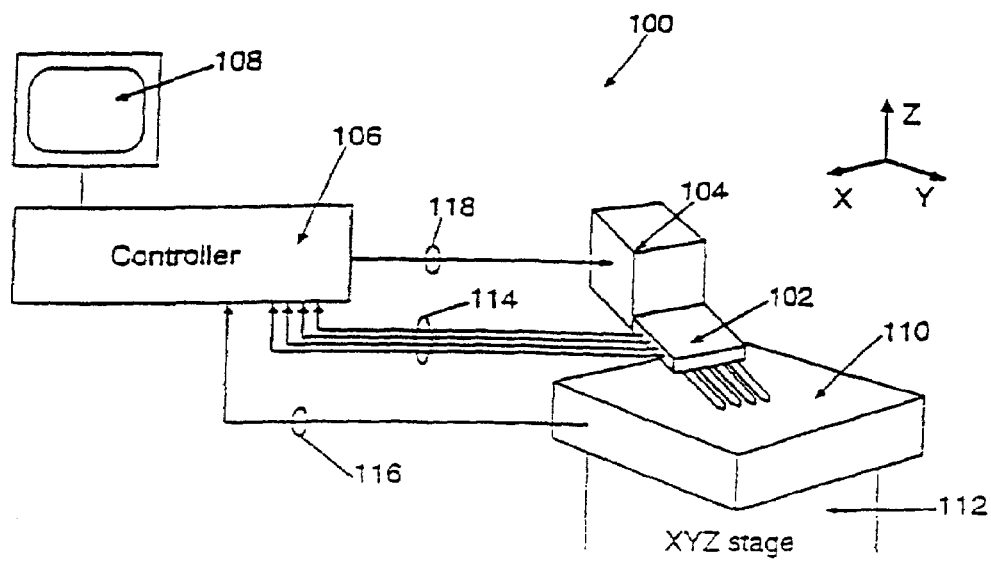
FIG. 7, depicts a set-up for measuring a test sample using a multi-point probe made in accordance with the present invention.

The preferred embodiment of the multi-point testing apparatus of the present invention is shown in FIG. 7. The figure depicts a multi-point testing apparatus 100, a test sample 110 is mounted on a stage 112 with an XYZ positioning mechanism. This mechanism can be controlled automatically or manually. A multi-point probe made according to present invention 102 is mounted above the surface of the test sample on a probe holder 104 which can be moved in the Z direction with a resolution of 0.1 µm or better. Optionally the probe holder 104 can be controlled with similar spatial resolution in the X and Y directions. The set-up 100 is similar to that of an AFM or a Scanning Tunneling Microscope (STM). Connections 114 from the probe end-points are input to a controller 106, which can move the multi-point probe with respect to the test sample 110. Optionally a connection 116 from the test sample 110 can also be input to the controller 106. The controller 106 can be a computer or a programmed micro-controller. By monitoring the four point resistance using the end-points of the four probe arms or the two point resistances between the end-points of the four probe arms and the test sample 110, the controller 106 can move the multi-point probe towards the test sample until all end-points of the four probe arms are in physical contact with the test sample. By holding the multi-point probe having the probe arm lengths in an angle relative to the surface of the test sample 110, smaller than perpendicular and larger than parallel, full individual probe arm flexibility is achieved, providing a safe mode of operation in regards to avoiding destruction of single devices on top surface of test sample. Then a measurement can be made of the test sample resistivity, and the controller 106 analyses the measured data and displays measurement information on display 108. The controller 106 may retract the multi-point probe, move the test sample 110 in the XY plane and repeat the procedure.

Figure 8:
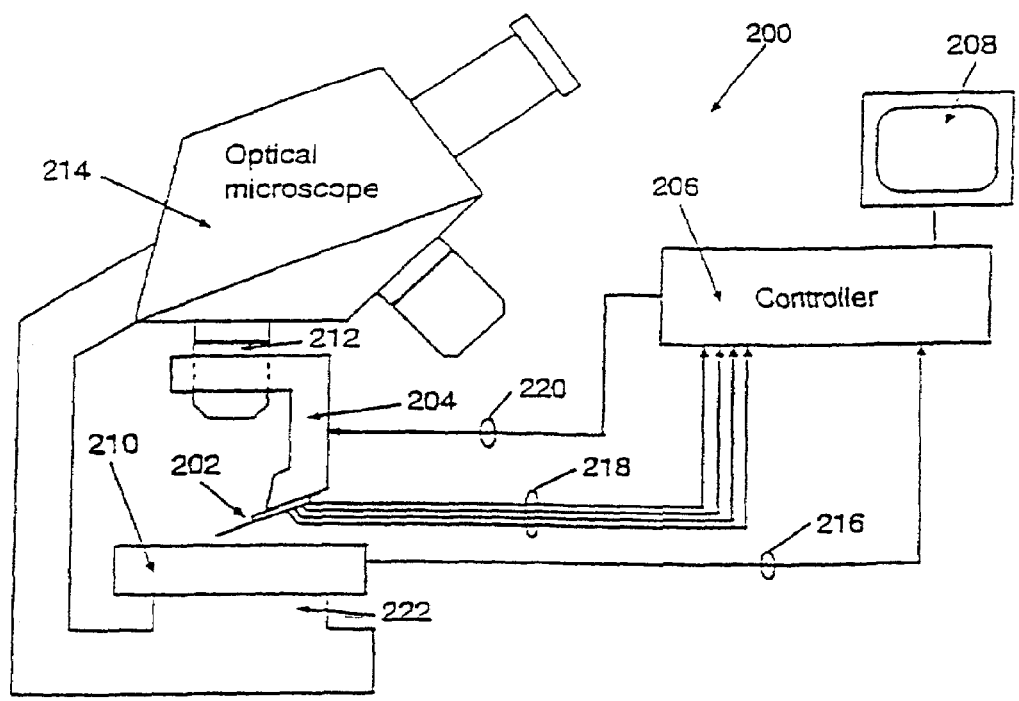
FIG. 8, illustrates a set-up having a multi-point probe made in accordance with the present invention mounted on an optical microscope.

FIG. 8 illustrates a similar apparatus 200 where the test sample stage consists of a XY positioned 222 on a standard optical microscope 214. A multi-point probe made in accordance to the present invention 202 is placed on a probe holder 204, which is mounted on a microscope objective 212, allowing the operator to identify features on the test sample surface and perform four point probe measurements at these features. In this manner μm sized test sample features such as single microelectronic devices or polycrystalline grains can be probed in a controlled fashion. Similar to the previously described apparatus 100, illustrated in FIG. 7, the four leads 218 from the probe are input to a controller 206 as well as a lead 216 connecting to the test sample; the controller outputs signals 220 controlling the movement of the probe holder, and the controller 206 analyses and presents the measurement data on display 208.

Figure 9:
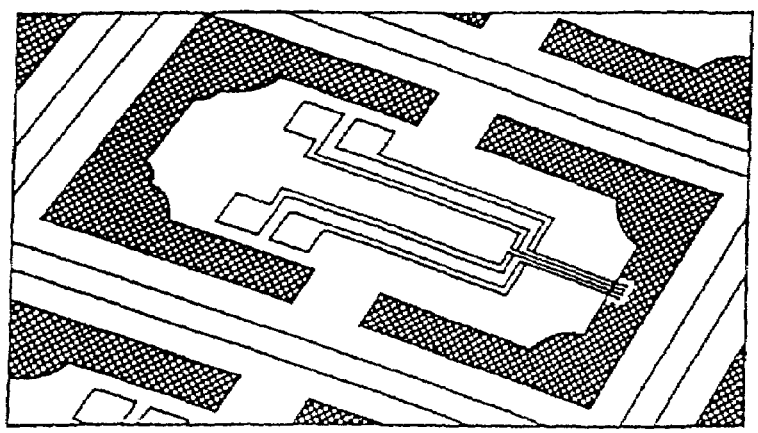
FIG. 9, pictures a detachable multi-point probe in a semi-conducting wafer.

FIG. 9, pictures a detachable multi-point probe in a semi-conducting wafer. A wafer can consist of several multi-point probes, which are detachable from the wafer. This production technique provides an extremely repeatable and safe method of fabrication of multi-point probes.

Figure 10:
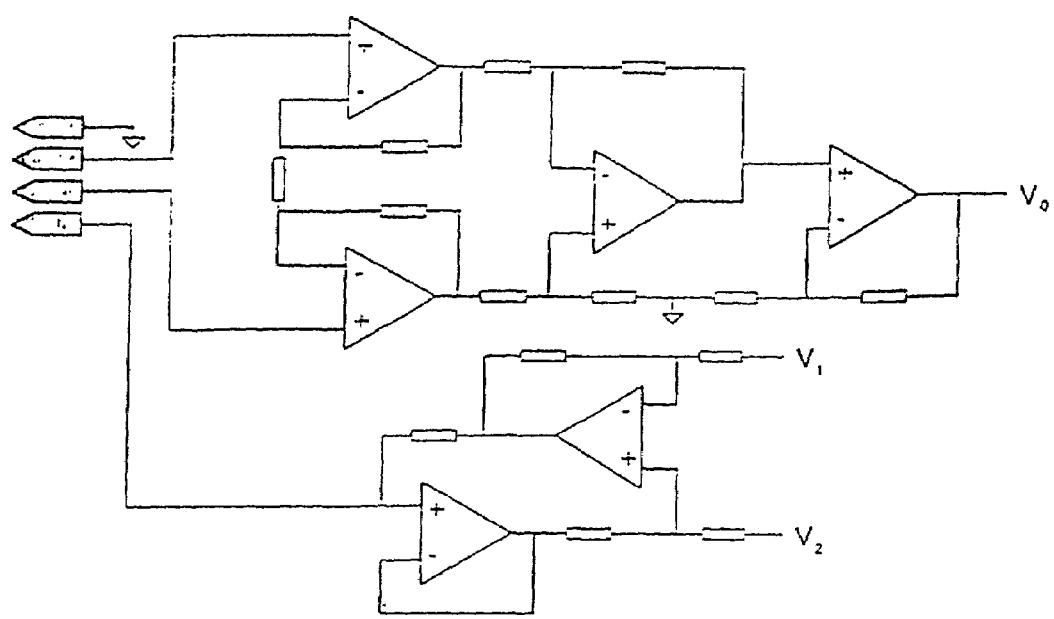
FIG. 10, shows a principal diagram of the circuit used for performing measurements, comprising an electrometer and a current source.

FIG. 10, shows a principal diagram of the circuit used for performing measurements, comprising an electrometer and a current source. Applying integrated circuit techniques for the fabrication of multi-point probes enables the possible integration of the electrometer, current source and additional circuit on the wafer.

Figure 11:
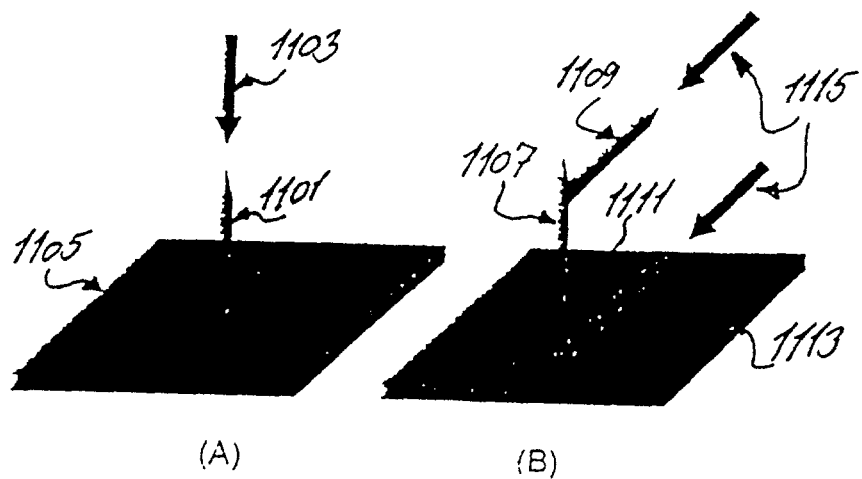
FIG. 11, shows an electron beam deposition. (a), shows a perpendicular electron beam disposition and (b), shows a tilted electron beam deposition either on the substrate or as continuation on top of an previously produced tip.

A particular preferred embodiment of the present invention utilises electron beam deposition techniques for growing tips on probe arms. FIG. 11(a), shows such an electron beam deposition grown from a surface 1105 of a probe arm having the electron beam 1103 in a perpendicular relation to the surface thus creating a primary tip 1101 having an axis perpendicular to surface plane. By tilting an electron beam 1115 in relation to a surface 1113 a tilted electron beam deposition grows either on the surface 1113 of substrate as a primary tip 1111 or as a secondary tip 1109 in continuation on top of a previously produced tip 1107 perpendicular to the surface 1113.

Figure 12:
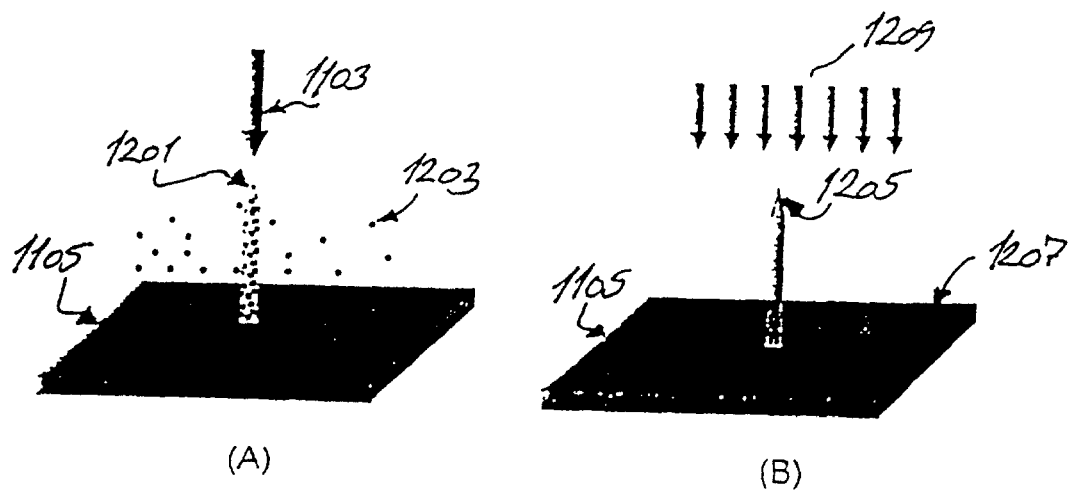
FIG. 12, shows metallization of tip. (a), shows in-situ metallization of tip applying conducting contaminants and (b), shows ex-situ metallization of tip applying subsequent metallization.

The electric properties of the tips may be modified by applying contaminants 1203 to a tip 1201 utilising an injection of metallo-organic compound at low partial pressure, hereby obtaining tips with resistances as low as 900 Ω (in-situ metallization). The electric properties of the tips may also be modified by applying a metallic cloud or evaporation 1209 creating metallic layers 1205,1207 on the tip 1201 and on the sur face 1105 subsequent to finalising the tip growth (ex-situ metallization). By applying subsequent evaporations 1209 using two or more application angles a good metallic coverage of the tip 1101 and the surface 1105 are achieved, thus providing useful tips 1101. FIG. 12, shows both methods for metallization of tips.

The geometry of a probe is shown in FIG. 13 in top view, side view and front view. The probe is shown having to probe arms 1301 on to which primary tips 1303 have been grown by utilising electron beam deposition. The primary tips 1303 create an angle 1307 (α1) between direction of axial length of the probe arm 1301 and direction of axial length of primary tips 1303. Secondary tips 1305 extend from the primary tips 1303 on the probe arms 1301. The primary tips 1303 furthermore have an inclination 1309 (β1) and the secondary tip 1305 and additional inclination 1311 (β2) in relation to the direction of the axial length of the probe arm 1301.

Several tip configurations are shown in FIG. 14. FIG. 14(a) shows four parallel probe arms, two outer probe arms 1401 and the two inner probe arms 1301 having two primary tips 1303 positioned on the two inner probe arms 1301. The two primary tips 1303 create an angle in relation to axial direction of the inner probe arms 1301 such that the primary tips 1303 point a common orientation. FIG. 14(b) shows the four parallel probe arms 1301, 1401 having four primary tips 1303, 1403 positioned so that the end point have equal tip separations. FIG. 14(c) shows the four probe arms 1301, 1401 each having primary tips 1303, 1403 extending from distal end. The two inner probe arms 1301 having the primary tips 1303 pointing toward a common orientation and the two outer probe arms 1401 pointing toward in axial direction of the outer probe arms 1401. FIGS. 14(d) to (f) show secondary tips 1305,1405 added to the primary tips 1303, 1403.

Figure 15:
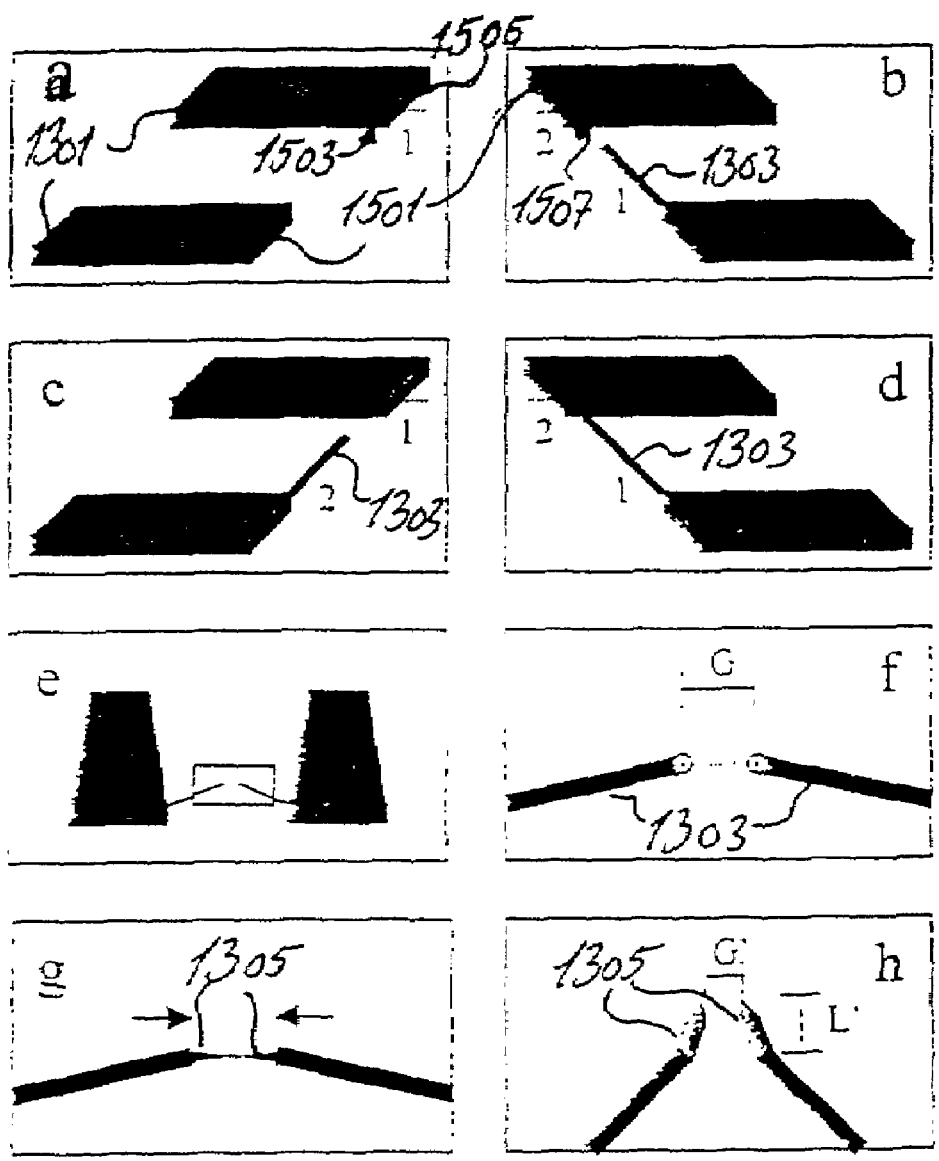
FIG. 15, shows tip fabrication of probe. (a), shows initial view. A tip is grown hereby on probe arm 1. (b), shows the sample rotated/tilted hereby obtaining a mirrored view. A tip is grown on probe arm 2 on the pointing line of tip 1. (c)-(d), shows the result of repeating the procedure until the gap G is slightly larger than the intended gap G'. (e), shows the sample rotated to obtain a frontal view, however additionally tilted to obtain the chosen angle α' of the secondary tips. (f)-(g), shows the secondary tips grown on both tip ends. (h), shows the intended gap G' and the lengths tuned by repeating steps (f)-(g)

The fabrication scheme for producing primary and secondary tips applying electron beam deposition is shown in FIG. 15. FIG. 15(a) shows the two probe arms 1301 having distal ends defined as 1501 and 1505. The electron beam is aimed at a corner 1503 of the surface of the distal end 1505, hereby producing the primary tip 1303. As shown in FIG. 15(b) the electron beam is subsequently aimed at a corner 1507 of the surface of the distal end 1501, hereby producing the second primary tip 1301. This procedure is repeated until the separation between the two primary tips 1301 is slightly larger than the intended gap G' between the primary tips 1301. The primary tips 1303 create an angle in relation to axial direction of probe arms 1301 and an angle in relation to the surfaces of the distal ends 1501,1505 such that the primary tips 1303 point away from the supporting body of the multi-point probe. The secondary tips 1305 furthermore create an angle in relation to axial direction of the primary tips 1303. In order to achieve this secondary angling of the secondary tips 1305 in relation to the primary tips 1301 the multi-point probe is rotated as shown in FIG. 15(e).

Figure 16:
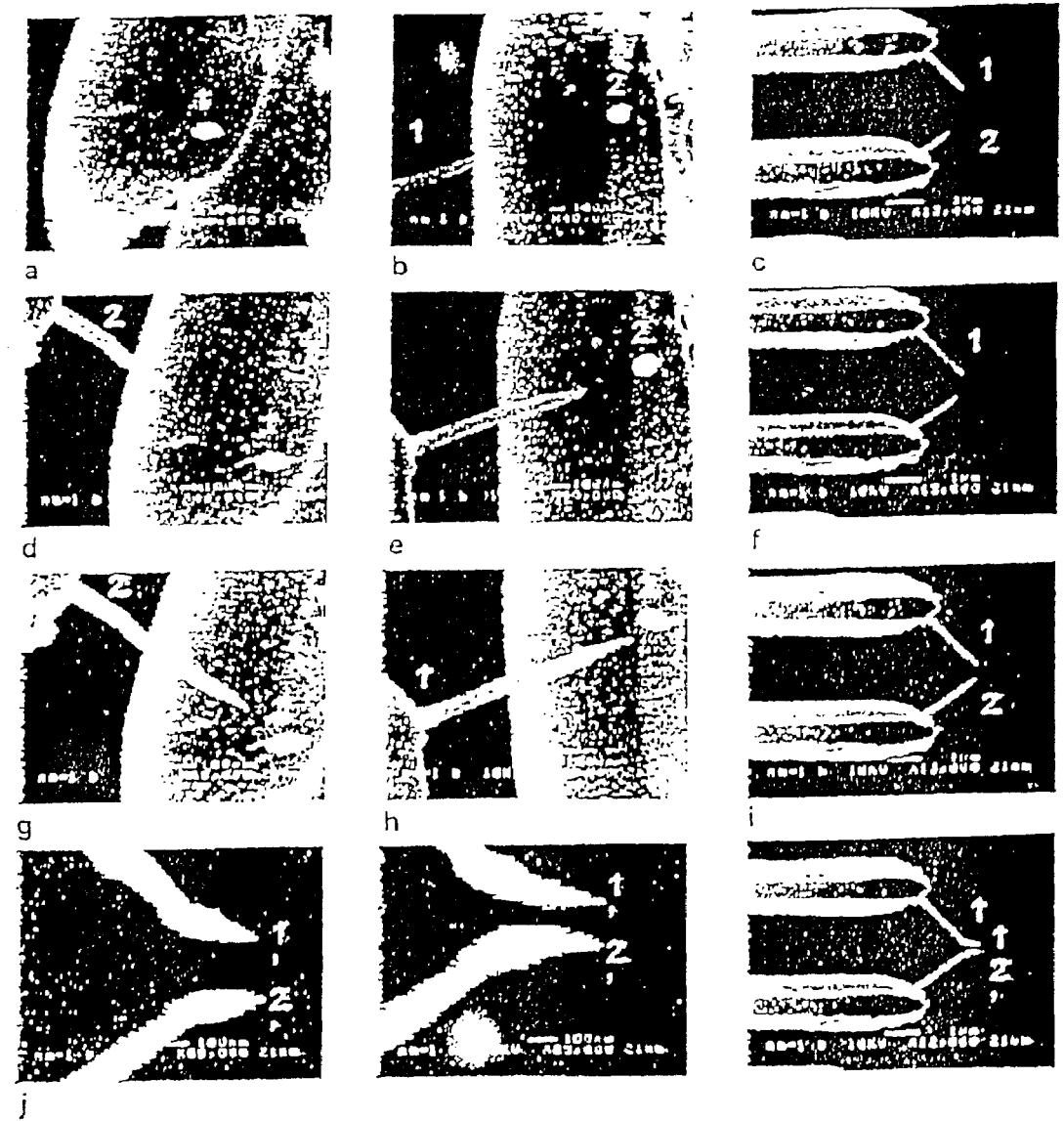
FIG. 16, shows scanning electron microscope pictures of the fabrication sequence (identical to FIG. 15). (a)-(c), shows initial growth of tip 1 and 2. (d)-(f), shows second iteration. (g)-(l), shows third iteration resulting in gap G' of 300 nm. (j), shows initial growth of secondary tips. (k), shows the secondary tips after narrowing in the gap and fine tuning the lengths to within 10 nm. (l) Overview picture of finished probes.
Figure 17:
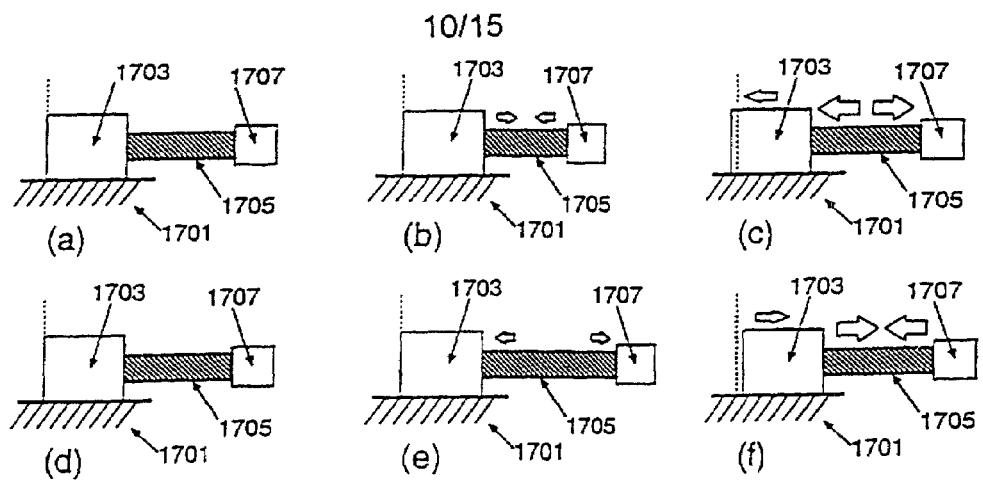
FIG. 17 illustrates the conventional apparatus for effecting fine movement.

FIG. 16, shows electron microscope pictures of the fabrication scheme presented above and in FIG. 15.

Figure 18:
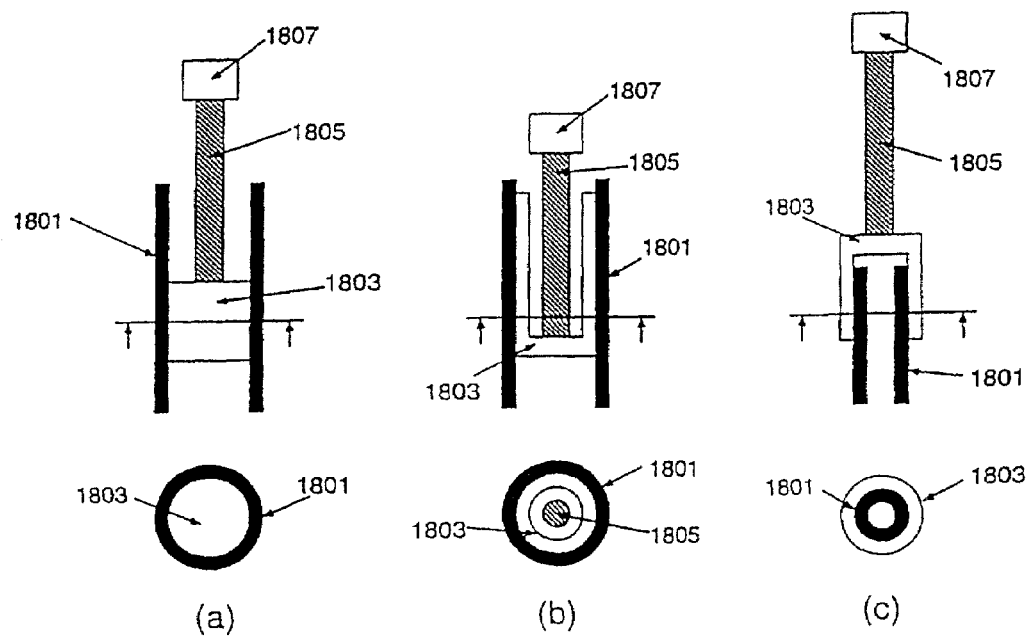
FIG. 18(a)-(c) are views of embodiments of the nano-positioning apparatus according to the present invention.

As shown in FIG. 18a, a preferred embodiment of the cylindrical nano-drive includes a cylindrical movable member 1803 movably supported in a surrounding substrate 1801. An electromechanical actuator 1805 is fixed on the movable member, and an inertial member 1807 is fixed in the distal end of said actuator. A distributed intrinsic frictional force exists between the movable member and the support. This frictional force originates from the internal elastic forces of the movable member and the support, and appears because of a high-precision machining of the movable member and the support. In a preferred embodiment, the support and the movable member is machined to fit within a tolerance of the diameter of less than one micrometer. This fit can be performed using milling, drilling, etching, honing, polishing, lapping, or any other known technique for machining of materials. In a preferred embodiment the movable member and the support consists of chemically inert, hard materials such as semiconductor carbides or nitrides. The electro-mechanical actuator has at least two electrodes to allow it to be moved in a direction parallel with the travel of the movable member. In a preferred embodiment the electro-mechanical actuator is a piezoelectric tube with one inner electrode and four outer electrodes, to provide both transverse and longitudinal motion of the actuator and thus of the inertial member.

In a second embodiment, the movable member in the cylindrical nano-drive according to the invention is a hollow tube which is closed in one end, as shown in FIG. 18b. The electromechanical actuator is fixed to the bottom of the tube.

In a third embodiment, the movable member in the cylindrical nano-drive according to the invention is a hollow tube which is closed in one end, and is movably supported on the inside of the tube as shown in FIG. 18c.

Figure 19:
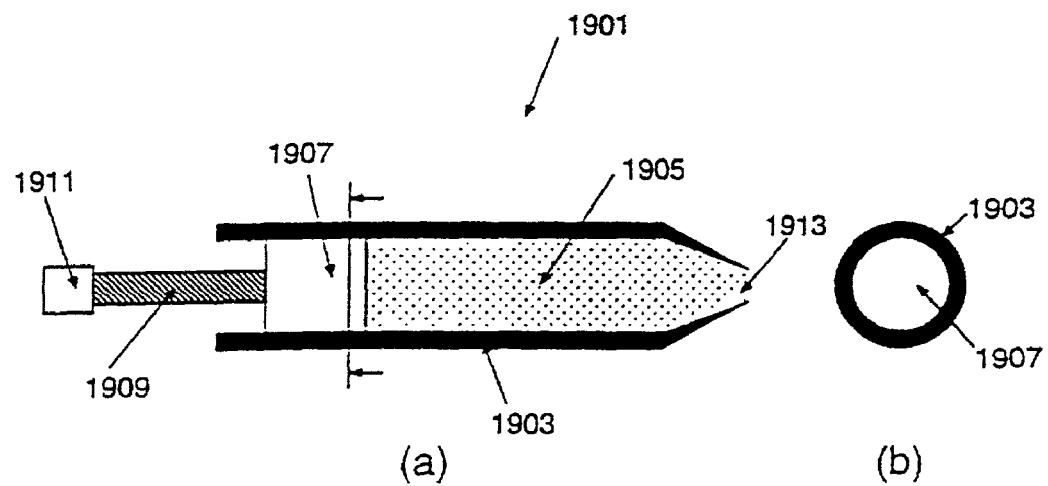
FIG. 19(a)-(b) are views of a micro-pipette apparatus according to the present invention.

FIG. 19a shows an embodiment of a micro-pipette 1901 according to the invention. The micro-pipette consists of a cylindrical nano-drive according to the invention, which has a movable member 1907 movably supported inside a tube 1903, said tube having an opening 1913 through which very small amounts of liquid or gas can be dispensed or acquired. An electro-mechanical actuator 1909 is fixed to the movable member, and an inertial member 1911 is fixed to the distal end of the actuator. The position of the movable member is controlled by electrical signals applied to the electromechanical actuator in such a way that the volume of gas or liquid in the tube is controlled with very high accuracy. FIG. 19b shows a sectional view of the micro-pipette.

Figure 20:
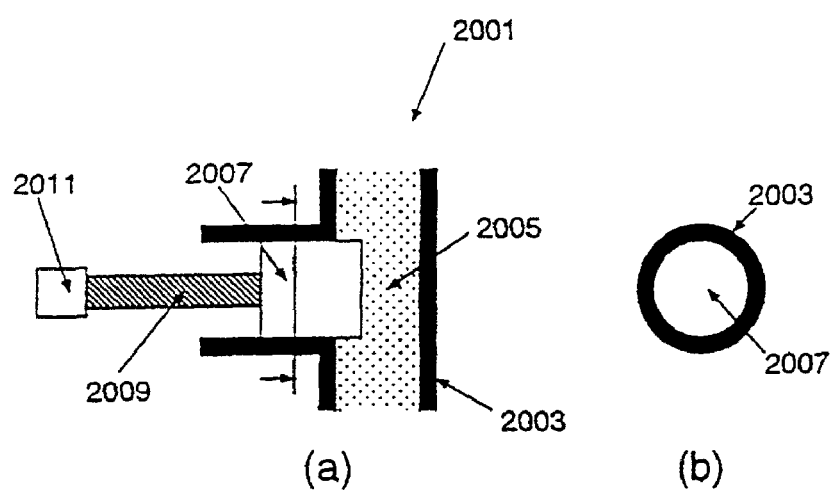
FIG. 20(a)-(b) are views of a micro-valve apparatus according to the present invention.

FIG. 20a shows an embodiment of a micro-valve 2001 according to the invention. The micro-valve consists of a cylindrical nano-drive according to the invention, which has a movable member 2007 movably supported inside a tube 2003 which has two openings through which a gas or liquid 2005 is flowing. The movable member can completely or in part block said flow by applying electrical signals to the electromechanical actuator 2009 which is fixed to the movable member, and thus the flow can be controlled with a very high degree of accuracy. FIG. 20b shows a sectional view of the micro-valve.

Figure 21:
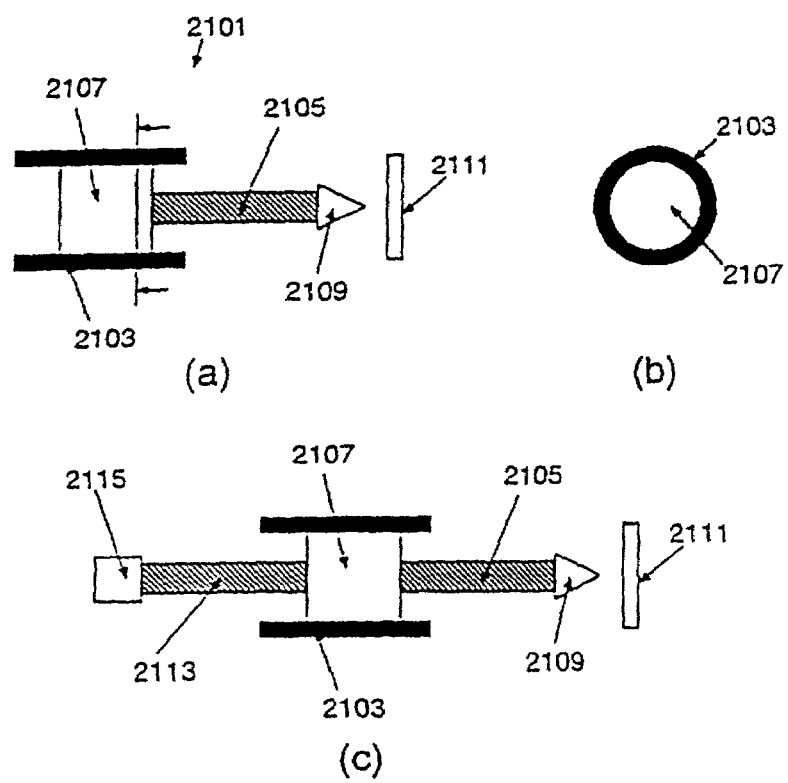
FIG. 21(a)-(c) are views of embodiments of the positioning apparatus according to the present invention.
Figure 23:
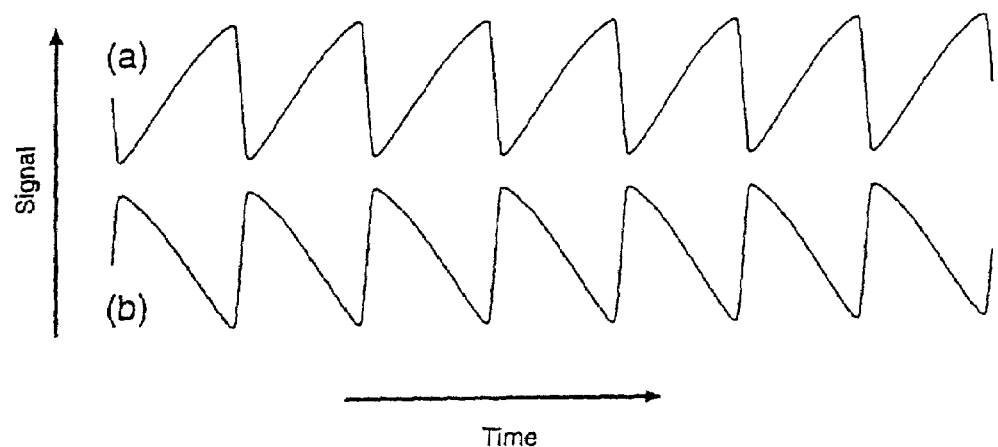
FIG. 23(a)-(b) are curve-forms illustrating the electrical fields to be applied to two electromechanical actuators fixed at opposing sides of the moving member of the present invention for effecting movement of said member.

FIG. 21a shows an embodiment of a nano-positioner 2101 according to the invention. The nano-positioner consists of a cylindrical nano-drive according to the invention with a movable member movably supported by a tubular substrate 2103. The position of the substrate can be changed by applying electrical signals to the electromechanical actuator 2105. In the distal end of the actuator is fixed a probe 2109 which is also the inertial member of the cylindrical nano-drive. The probe can be moved in all directions relative to a material 2111 by applying electrical signals to the electromechanical actuator. FIG. 21b shows a sectional view of the nano-positioner. FIG. 21c shows an alternative embodiment of the nano-positioner where the movable member has two actuators fixed at opposing sides. The additional actuator 2107 has an inertial member 2113 fixed at the distal end. The actuator 2113 can be controlled independent of the actuator 2105 which allows the probe to be move continuously over distances of millimeter in the direction of movement of the movable member relative to the material. The electrical fields necessary to achieve this are shown schematically in FIGS. 23a-b. A saw-tooth-like waveform is applied to one of the actuators, while a similar waveform of opposing sign is applied to the other actuator. By fine-tuning of the amplitude and phase of the two waveforms, a continuous movement of the probe will appear.

Figure 22:
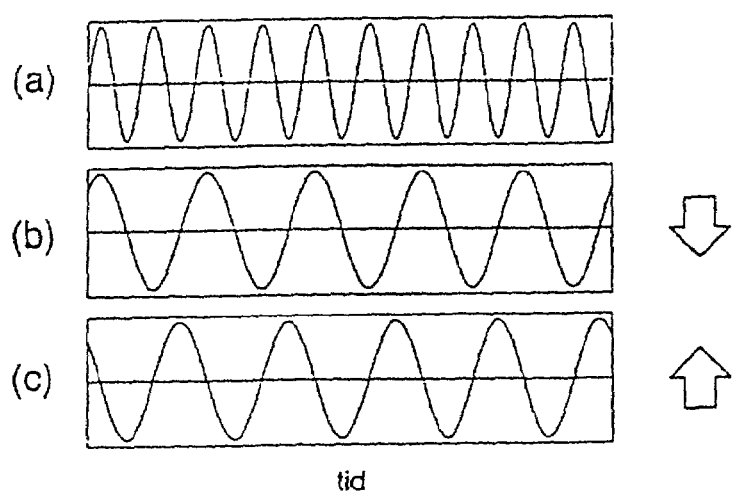
FIG. 22(a)-(c) are curve-forms illustrating the electrical fields to be applied to a single electromechanical actuator on the moving member of the present invention for effecting movement of said member.

FIGS. 22a-c shows curve-forms for electrical signals to control the movement of the movable member in a cylindrical nano-drive according to the invention in which the actuator can be moved in both transverse and longitudinal directions. The longitudinal movement of the actuator is controlled by a harmonic oscillating signal as shown in FIG. 22a. When one or both transverse movements are driven by a harmonic oscillating electrical signal with half the frequency of the longitudinal signal, and when all extreme on the transverse signal coincide with either maxima or minima in the longitudinal signal, then the movable member will be displaced either up or down. These curve-forms are shown in FIGS. 22b-c. By changing the amplitude and the frequency of the harmonic signals, the movement of the movable member per period of the harmonic signal can be made arbitrarily small.

Figure 24:
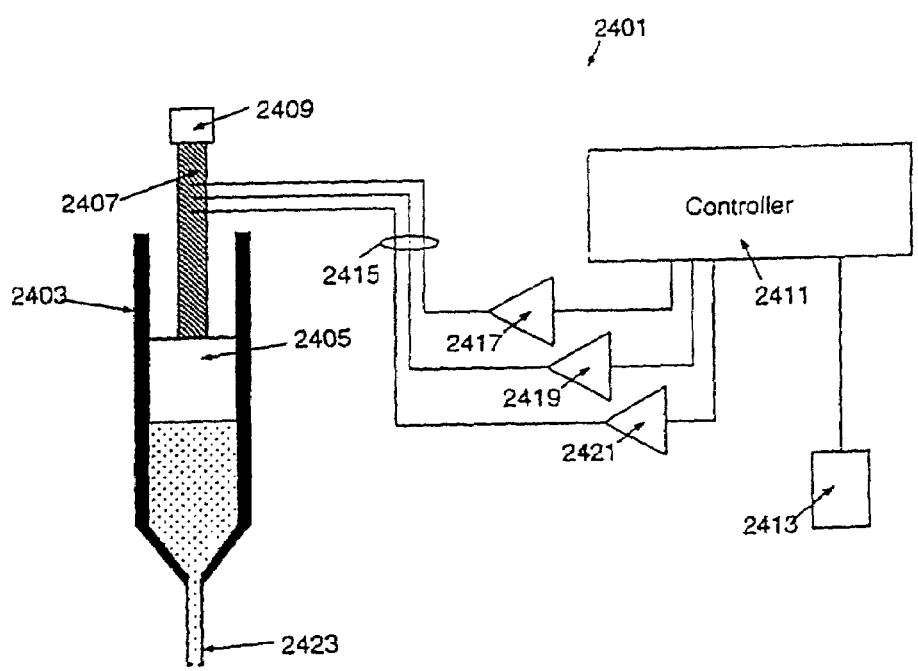
FIG. 24 is a view schematically showing a micro-pipette apparatus according to the present invention.

FIG. 24 shows schematically a complete micro-pipette apparatus 2401 according to the invention. The micro-pipette is constructed as described above with reference to FIG. 19, with the movable member 2405 movably supported inside a tube 2403 which is tapered into a pipette tip 2423. On the movable member is fixed an electromechanical actuator 2407 which has an inertial member 2409 fixed to the distal end. The electrodes on the electromechanical actuator are connected to a control-box 2411 through amplifiers 2417-2421 with electrical wires 2415. The control box can include a computer, a microprocessor or discrete digital or analog components. The control box can be controlled remotely by a computer or with a panel 2413 on which the speed and direction of the movable member can be selected.

In a more advanced embodiment of the micro-pipette apparatus, the micro-pipette is attached to a manual or motorized stage, in such a way that the micro-pipette tip can be moved relative to the media in which gas or liquid is to be dispensed or extracted. In the case of an motorized stage, an automatic micro-pipette system is realized, in which the micro-pipette and perform movements synchronized with dispensing or extracting fluid or gas.

Figure 25:
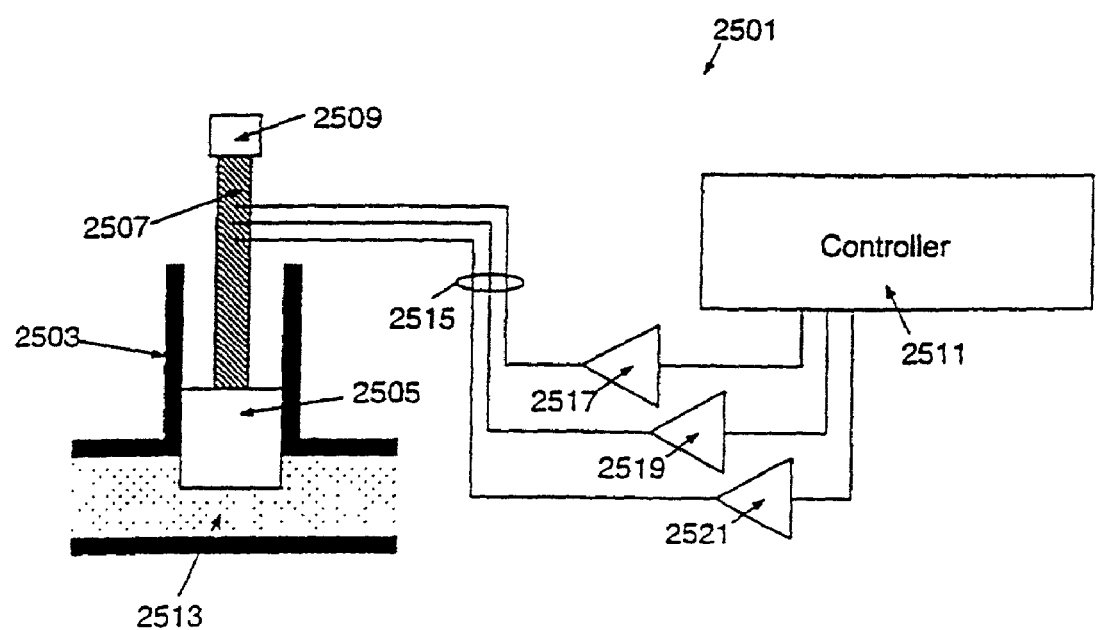
FIG. 25 is a view schematically showing a micro-valve apparatus according to the present invention

FIG. 25 shows schematically a complete micro-valve apparatus 2501 according to the invention. The micro-valve is constructed as described above with reference to FIG. 20, with a movable member 2505 movably supported inside a tube 2503 in which a transverse flow of gas or liquid 2513 is present. On the movable member is fixed an electromechanical actuator 2507 which has an inertial member 2509 fixed to the distal end. The electrodes on the electromechanical actuator are connected to a control-box 2511 through amplifiers 2517-2521 with electrical wires 2515. The control box can include a computer, a microprocessor or discrete digital or analog electronic components.

Figure 26:
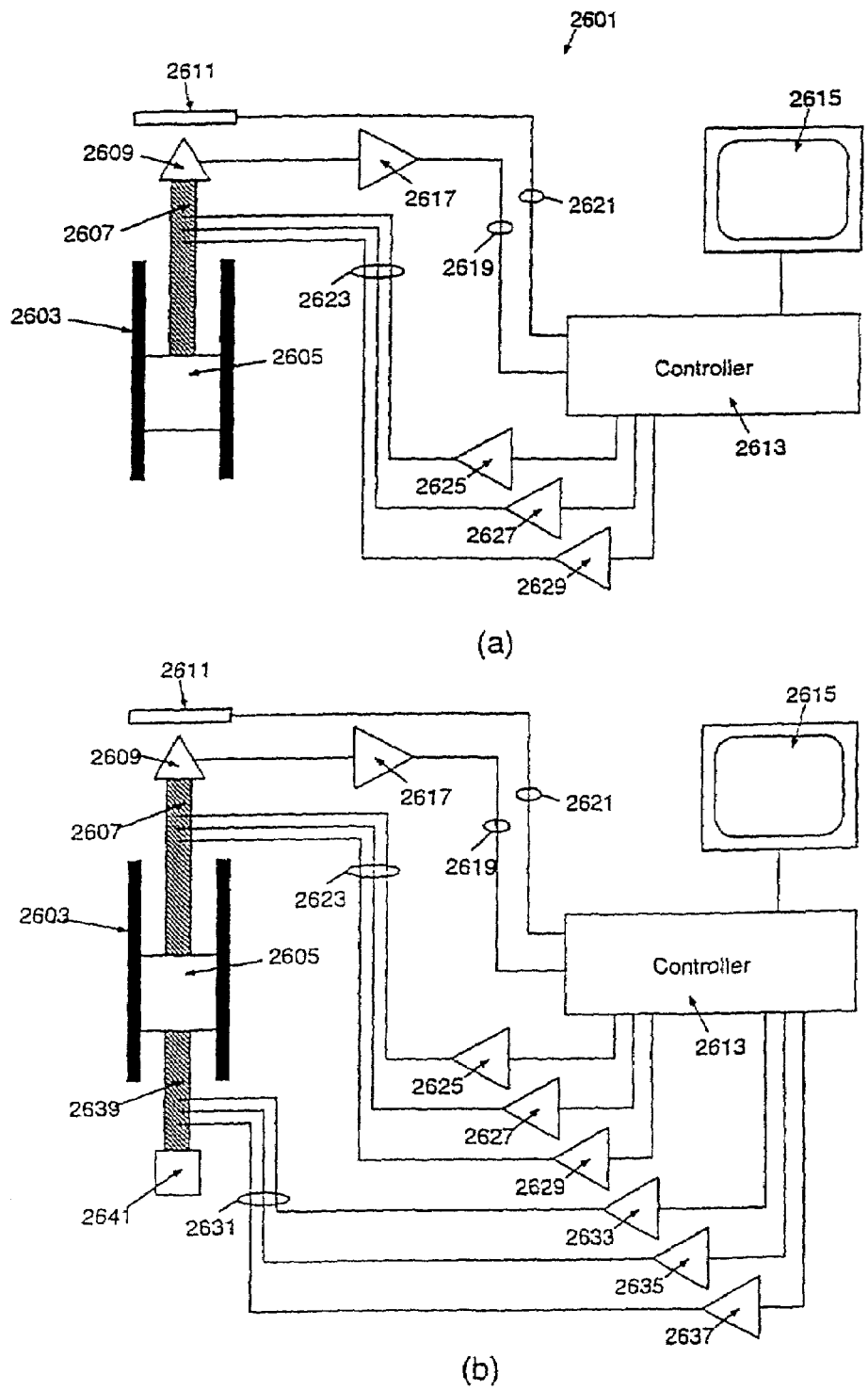
FIG. 26(a)-(b) are views schematically showing embodiments of a nano-positioning apparatus according to the present invention.

FIG. 26a shows schematically a complete nano-positioner apparatus 2601 according to the invention. The nano-positioner apparatus is constructed from an embodiment of the cylindrical nano-drive according to the invention in which the inertial member 2609 comprises a microscopic probe, for example a very sharp electrode. The nano-positioner apparatus can move the probe relative to a sample 2611. An electrical connection 2619 from the probe can be sent though an amplifier 2617 to a control box 2613. An electrical connection 2621 can also be made between the sample and the control box. The control box contains a feedback system which uses the electrical signal from the microscopic probe to adjust the position of the microscopic probe relative to the sample. The position of the probe is controlled by at least one electrical connection 2623 between the control box and the electromechanical actuator 2607 on the movable member 2605 of the cylindrical nano-drive, which is movably supported in a surrounding substrate 2603. The electrical signal to the actuator can pass through an amplifier 2625-2629. In a preferred embodiment the actuator comprises a piezoelectric tube with electrodes allowing transversal and longitudinal movement of the microscopic probe with respect to the sample. In this way a scan of the sample material can be obtained as a function of position, and the obtained data can be presented on a display 2615 connected to the control box.

FIG. 26b shows an alternative embodiment of the nano-positioner apparatus, further comprising a second electromechanical actuator 730 fixed to the movable member of the cylindrical nano-drive according to the invention. A inertial member 732 is fixed to the distal end of the electromechanical actuator. There is at least one electrical connection 2631 between the second electromechanical actuator and the control box. The electrical signal can pass though an amplifier 2633-2637.

Example Showing the Usage of the Multi-point Probe

The probe chips (illustrated in FIG. 9) are broken out of the wafers and are mounted on ceramic dies (5 mm×10 mm) with four big thick-film electrode pads, using epoxy. The conductive probe arms on the silicon chips are connected to the pads on the ceramic dies by bonding 25 µm thick gold wires between them, using a Kulicke-Soffa wedge-bonding machine.

The ceramic chips are fixed mechanically and contacted electrically on an aluminum mount, which is machined to fit around a microscope objective on a Karl-Suss probe station. The mount allows the conductive probe arms of the multi-point probe to be in focus in the middle of the field of view of the microscope. The test sample can then be moved into focus using the normal vertical stage of the microscope. When the test sample is in focus the multi-point probe will contact the test sample and a measurement can be performed. This set-up is similar to the general illustration in FIG. 8.

Electronics consisting of an electrometer and a current source is built into the aluminum mount to minimise the distance between the probe and the electronics. This keeps the noise in the measurements at a minimum. The principal diagram of the circuit is shown in FIG. 10. The two inner conductive probe arms of the multi-point probe are connected to an electrometer (an instrumentation amplifier) with an input impedance of more than 10GΩ and an amplification factor of 5000. The peripheral two conductive probe arms of the probe are connected to the current source (a differential voltage to current converter) which delivers an adjustable output in the range of 10 nA to 1 µA.

The current output is proportional to the voltage difference V1-V2. These voltages are generated externally by a computer equipped with a digital to analogue converter. The same computer detects the output voltage Vo of the electrometer through an attached analogue to digital converter. Batteries power the circuit in order to make it float with respect to ground.

A measurement is performed by sampling the voltage of the electrometer for both polarities of the current, taking the average of the two values. This averaging procedure is useful for eliminating thermal drift in the electronics.

Essential Features of the Invention Represented by Following Points

1. A multi-point probe for testing electric properties on a specific location of a test sample, comprising:
    (a) a supporting body defining a first surface;
    (b) a first multitude of conductive probe arms each of said conductive probe arms defining a proximal end and a distal end being positioned in co-planar relationship with said first surface of said supporting body, and said conductive probe arms being connected to said supporting body at said proximal ends thereof and having said distal ends freely extending from said supporting body, giving individually flexible motion to said first multitude of conductive probe arms; and
    (c) said conducting probe arms originating from a process of producing said multi-point probe including producing said conductive probe arms on supporting wafer body in facial contact with said supporting wafer body and removal of a part of said wafer body providing said supporting body and providing said conductive probe arms freely extending from said supporting body.

2. The multi-point probe according to point 1, wherein said first multitude of conductive probe arms are unidirectional, constituting a first multitude of parallel free extensions of said supporting body.

3. The multi-point probe according to points 1 and 2, wherein said supporting body further comprising a second surface parallel to said first surface and said multi-point probe further comprising an additional multitude of conductive probe arms defining a proximal end and a distal end being positioned in co-planar relationship with said second surface of said supporting body, and said additional conductive probe arms being connected to said supporting body at said proximal ends thereof and having said distal ends freely extending from said supporting body, giving individually flexible motion to said additional multitude of conductive probe arms.

4. The multi-point probe according to points 1-3, wherein said first multitude of conductive probe arms are in a multiple of 2, ranging from at least 2 said conductive probe arms to 64 said conductive probe arms, preferable application having 4 said conductive probe arms.

5. The multi-point probe according to points 1-4, wherein said first multitude of conductive probe arms have a substantially rectangular cross section defining: the dimension of width as a distance between the lines of said rectangular cross section perpendicular to the plane of said first surface of said supporting body, the dimension of depth as a distance between the lines of said rectangular cross section parallel to the plane of said first surface of supporting body, and the dimension of length as a distance from said proximal end of said conductive probe arms to said distal end of said conductive probe arm.

6. The multi-point probe according to points 1-5, wherein said first multitude of conductive probe arms have a ratio of said length to said width within the range of 500:1 to 5:1, such as ratios 50:1 and 10:1, preferable application having the ratio of 10:1.

7. The multi-point probe according to points 1-6, wherein said first multitude of conductive probe arms have a ratio of said width to said depth within the range of 20:1 to 2:1, preferable application having the ratio of 10:1.

8. The multi-point probe according to points 1-7, wherein said first multitude of conductive probe arms has tapered elements extending from said distal end of said conductive probe arms.

9. The multi-point probe according to points 1-7, wherein said first multitude of conductive probe arms has pointed shaped elements extending from said distal end of said conductive probe arms.

10. The multi-point probe according to points 1-7, wherein said first multitude of conductive probe arms has enlarged circular, elliptic or orthogonal squared elements extending form said distal ends of said conductive probe arms.

11. The multi-point probe according to points 1-10, wherein said first multitude of conductive probe arms have said lengths in the range of 20 μm to 2 mm, preferably a length of 200 μm.

12. The multi-point probe according to points 1-11, wherein said first multitude of conductive probe arms have a separation of distal ends of said conductive probe arms in the range of 1 μm to 1 mm, preferable application having said separations of 20 μm, 40 μm and 60 μm.

13. The multi-point probe according to points 1-12, further comprising a second multitude of conductive electrodes being position on second multitude of areas defined on said first surface between said first multitude of conductive probe arms, and comprising an insulating spacing between said electrodes and said conductive probe arms, said second multitude of conductive electrodes especially being suitable for active guarding.

14. The multi-point probe according to point 13, wherein said second multitude of areas are swaged in relation to the plane of said first surface of said supporting body.

15. The multi-point probe according to point 13, wherein said second multitude of areas are elevated in relation to the plane of said first surface of said supporting body.

16. The multi-point probe according to point 13, wherein said second multitude of areas are in co-planar relation with said first surface of said supporting body between said first multitude of conductive probe arms.

17. The multi-point probe according to points 13-16, wherein said second multitude of areas are combinations of swaged, elevated and co-planar in relation to the plane of said first surface of said supporting body.

18. The multi-point probe according to points 13 and 17, wherein said second multitude of swaged areas undercut said first multitude of conductive probe arms on said supporting body providing a supporting surface of said supporting body smaller than the surface of said conductive probe arms facing said supporting body.

19. The multi-point probe according to points 13, 17 and 18, wherein said second multitude of swaged areas undercutting said first multitude of conductive probe arms are originating from a process of producing said multi-point probe including producing said conductive probe arms on supporting wafer body in facial contact with said supporting wafer body and removal of a part of said wafer body providing said second multitude of swaged areas on said supporting body by a process of chemical vapour deposition (CVD), plasma enhanced CVD (PECVD), electron cyclotron resonance (ECR) or sputtering, mechanical grinding, etching, high resolution lithographic methods such as electron-beam lithography, atomic force microscopy (AFM) lithography or laser lithography.

20. The multi-point probe according to points 1-19, wherein supporting body is of a ceramic material.

21. The multi-point probe according to points 1-19, wherein supporting body is of a semiconducting material.

22. The multi-point probe according to point 21, wherein said semiconducting material comprising Ge, Si or any combinations thereof.

23. The multi-point probe according to points 20-22, comprising:
(a) a conductive layer positioned on said multitude of conductive probe arms; and
(b) a conductive layer acting as said electrodes on said supporting body between said first multitude of conductive probe arms.

24. The multi-point probe according to point 23, wherein said conductive layer comprising conductive materials such as Au, Ag, Pt, Ni, Ta, Ti, Cr, Cu, Os, W, Mo, Ir, Pd, Cd, Re, conductive diamond, metal silicides or any combinations thereof.

25. The multi-point probe according to points 1-24, wherein said multi-point probe further comprising:
(d) a third multitude of conductive tip elements extending from said distal end of said first multitude of conductive probe arms; and
(e) said conductive tip elements originating from a process of metallization of electron beam depositions on said first multitude of conductive probe arms at said distal ends thereof.

26. The multi-point probe according to point 25, wherein each of said third multitude of conductive tip elements comprises a primary section and a secondary section, said conductive tip elements being connected to said conductive probe arms through respective primary sections thereof and said secondary sections defining free contacting ends.

27. The multi-point probe according to points 25 or 26, wherein each of said primary sections defines a first axial direction, said first axial direction constituting an increase of the total distance between said supporting body and said free contacting ends.

28. The multi-point probe according to point 27, wherein said first axial direction of said primary section constitutes a decrease of separation between said free contacting ends of said third multitude of conductive tip elements.

29. The multi-point probe according to points 27-28, wherein said first axial direction of said primary section constitutes a decrease of separation between adjacent said free contacting ends of said third multitude of conductive tip elements.

30. The multi-point probe according to points 25-29, wherein each of said secondary sections defines a second axial direction, said second axial direction constituting an increase of the total distance between said supporting body and said free contacting ends.

31. The multi-point probe according to point 30, wherein said second axial direction of said secondary section constitutes a decrease of separation between said free contacting ends of said third multitude of conductive tip elements.

32. The multi-point probe according to points 30-31, wherein said secondary axial direction of said secondary section constitutes a decrease of separation between adjacent said free contacting ends of said third multitude of conductive tip elements.

33. The multi-point probe according to points 27-32, wherein said first axial direction of said primary sections extend parallel to the plane defined by said first surface of said supporting body.

34. The multi-point probe according to points 27-32, wherein said first axial direction of said primary sections extend in a direction converging towards the plane defined by said second surface of said supporting body.

35. The multi-point probe according to points 30-34, wherein said second axial direction of said secondary sections extend parallel to the plane defined by said first surface of said supporting body.

36. The multi-point probe according to points 30-34, wherein said second axial direction of said secondary sections extend in a direction converging towards the plane defined by said second surface of said supporting body.

37. The multi-point probe according to points 25-36, wherein said third multitude of conductive tip elements is equal to said first multitude of conductive probe arms, preferable application having third multitude dividable with 2.

38. The multi-point probe according to points 25-36, wherein said third multitude of conductive tip elements is less than said first multitude of conductive probe arms, preferable application having third multitude dividable with 2.

39. The multi-point probe according to points 25-36, wherein said third multitude of conductive tip elements is greater than said first multitude of conductive probe arms, preferable application having third multitude dividable with 2.

40. The multi-point probe according to points 25-39, wherein said third multitude of conductive tip elements have a separation of said free contacting ends of said conductive tip elements in the range of 1 nm-100 nm, preferable application having said separations of 2 nm, 5 nm, 10 nm, 20 nm, 50 nm, 100 nm.

41. The multi-point probe according to points 25-40, wherein each of said conductive tip elements define an overall length as distance between said distal ends of conductive probe arms and said free contacting ends of said conductive tip elements, said overall length being in the range of 100 nm to 100 μm, preferable application having said overall length in the ranges 500 nm to 50 μm and 1 μm to 10 μm.

42. The multi-point probe according to points 25-41, wherein each of said conductive tip elements define a diameter, said diameter being in the range of 10 nm to 1 μm, preferable application having said overall length in the ranges 50 nm to 500 nm.

43. The multi-point probe according to points 25-42, wherein said third multitude of conductive tip elements mainly consists of carbon.

44. The multi-point probe according to points 25-43, wherein said third multitude of conductive tip elements further consists a concentration of contaminants.

45. The multi-point probe according to points 25-42, wherein said third multitude of conductive tip elements originate from a process of tilted electron beam deposition.

46. The multi-point probe according to points 25-42, wherein said third multitude of conductive tip elements originate from a process of perpendicular electron beam deposition.

47. The multi-point probe according to points 25-42, wherein said third multitude of conductive tip elements originate from a process of a combination of tilted electron beam deposition and perpendicular electron beam deposition.

48. The multi-point probe according to points 25-47, wherein said metallization of said third multitude of conductive tip elements originates from a process of in-situ metallic deposition.

49. A method of producing a multi-point probe comprising the following steps:
(i) producing a wafer body;
(ii) producing a first multiple of conductive probe arms positioned in co-planar and facial relationship with said wafer body;
(iii) removing a part of said wafer body for providing said conductive probe arms freely extending from said non-removed part of said wafer body constituting a supporting body from which said conductive probe arms extend freely; and
(iv) producing a third multitude of conductive tip elements extending from said distal end of said first multitude of conductive probe arms.

50. The method according to point 49, wherein the technique of applying the conductive probe arms in co-planar and facial relationship with the supporting wafer body, involves microfabrication technique, planar technique, CMOS technique, thick-film technique, thin-film technique or a combination thereof.

51. The method according to points 49 and 50, wherein the technique of applying the third multitude of conductive tip elements extending from said distal end of said first multitude of conductive probe arms, involves metallization of electron beam depositions.

52. The method according to points 49-51, wherein said producing of said third multitude of conductive tip elements comprising steps:
(a) mounting of multi-point probe having said first surface of supporting body parallel to horizontal on to holding means in a microscope chamber;
(b) selecting angles α and β describing inclination of said primary section and said secondary section of said conductive tip elements;
(c) measuring of deposition rate by focusing an electron beam in one location for 5 minutes and measuring the resulting length of a first deposition;
(d) tilting and rotating said holding means to give a field of view of said first deposition from an viewing angle identical to angle of said electron beam showing accordance with said selected angles α and β;
(e) depositing a length on one of said distal ends of said conductive probe arms;
(f) tilting and rotating said holding means to give a field of view of position for a second deposition;
(g) depositing said length on neighbouring said distal end of said conductive probe arms;
(h) repeating steps c through g until separation of conductive probe arms is approximately 100 nm greater than the indented separation of conductive probe arms;
(i) selecting an angle α1 describing a inclination of said secondary section;
(j) tilting and rotating said holding means selecting β=0 and selecting an α=α1;
(k) extending said secondary sections in continuation of said primary sections; and
(l) ensuring that the depositing progresses by alternating the position of the electron beam on first and second deposition.

53. The method according to points 49-52, the multi-point probe having any of the features of the multi-point probe according to any of the points 1-48.

54. A cylindrical nano-drive for in particular driving tools with high resolution and comprising
a supporting body defining an inner open ended cylindrical space having a first longitudinal axis and an inner cylindrical surface,
a movable member defining an outer contact surface, a first mounting surface and a second mounting surface, said outer contact surface mating said inner open ended cylindrical space, said movable member being inserted into said inner open ended cylindrical space and said contacting surface of said movable member and said inner cylindrical surface of said inner open ended cylindrical space creating a sliding fit between said movable member and said supporting body, said sliding fit between said movable member and said supporting body being established along the entire area of contact between said inner cylindrical surface and said outer contact surface and being provided by said outer contact surface and said inner cylindrical surface defining therebetween a spacing of a dimension having a size at any specific area of said area of contact of no more than 1 to 5 orders of power of atomic dimensions, preferably 1 to 3, 3 to 5 or 2 to 4, an inertial body having a first proximal end and second proximal end and providing counter weight for said movable member, and an actuator defining a second longitudinal axis, a third proximal end and a fourth proximal end, said actuator being connected at said third proximal end to said first proximal end of said inertial body and said fourth proximal end of said actuator being connected to said first mounting surface of said movable member, said second longitudinal axis of said actuator being substantially parallel to said first longitudinal axis of said open ended cylindrical space, said actuator moving said movable member in said cylindrical space by contraction and extension of said actuator in a direction parallel to said first longitudinal axis.

55. The cylindrical nano-drive according to point 54, wherein said supporting body is constructed from chemically inert and hard materials such as carbides and nitrides.

56. The cylindrical nano-drive according to point 54 or 55, wherein said supporting body defining an overall triangular, rectangular, elliptical, conical, cubical, spherical or cylindrical outer surface or any combinations thereof, preferably said supporting body defining an overall cylindrical outer surface.

57. The cylindrical nano-drive according to point 56, wherein said cylindrical outer surface of said supporting body defines a third longitudinal axis substantially coaxial with said first longitudinal axis.

58. The cylindrical nano-drive according to points 54 to 57, wherein said inner open ended cylindrical space defines a circular cross sectional area having an inner diameter.

59. The cylindrical nano-drive according to any of the points 54 to 58, wherein said movable member is constructed from chemically inert and hard materials such as carbides and nitrides.

60. The cylindrical nano-drive according to any of the points 54 to 59, wherein said movable member defining an overall triangular, rectangular, elliptic, cubical, spherical, conical or cylindrical outer shape or any combinations thereof, preferably said movable member defining an overall solid cylindrical shape defining said first mounting surface at one end of said solid cylindrical shape and said second mounting surface at the other end of said cylindrical shape, said said first and said second mounting surface defining a circular area having an outer diameter substantially equal to said inner diameter of said open ended cylindrical surface, so as to provide a sliding fit between said movable member and said supporting body.

61. The cylindrical nano-drive according to any of the points 54 to 59, wherein said movable member defining an overall cylindrical cup shape having an outer diameter substantially equal to said inner diameter of said open ended cylindrical surface constituting a sliding fit between said movable member and said inner cylindrical surface of said supporting body and defining a bottom inner cup surface constituting said first mounting surface and a bottom outer cup surface constituting said second mounting surface and having said fourth proximal end of said actuator mounted to said first mounting surface with said second longitudinal axis of said actuator being substantially parallel to said first longitudinal axis of said open ended cylindrical space.

62. The cylindrical nano-drive according to any of the points 54 to 59, wherein said movable member defining an overall cylindrical cup shape having an inner diameter substantially equal to said outer diameter of said cylindrical surface of said supporting body constituting a sliding fit between said movable member and said cylindrical surface of said supporting body and defining a bottom outer cup surface constituting said first mounting surface and a bottom inner cup surface constituting said second mounting surface and having said fourth proximal end of said actuator mounted to said first mounting surface with said second longitudinal axis of said actuator being substantially parallel to said first longitudinal axis of said open ended cylindrical space.

63. The cylindrical nano-drive according to any of the points 54 to 62, wherein said inertial body is constructed from materials such as chemically inert and hard materials such as carbides and nitrides.

64. The cylindrical nano-drive according to any of the points 54 to 63, wherein said inertial body defining an overall cubical, conical, triangular, rectangular, elliptic, spherical or cylindrical outer shape or any combinations thereof, preferably said inertial body defining an overall cylindrical shape having a third longitudinal axis connected at said first proximal end to said third proximal of said actuator having said third longitudinal axis and said first longitudinal axis substantially co-axial.

65. The cylindrical nano-drive according to any of the points 54 to 64, wherein said inertial body further comprising probing means.

66. The cylindrical nano-drive according to any of the points 54 to 65, wherein said actuator defining an overall triangular, cubical, conical, rectangular, elliptic, spherical or cylindrical shape or any combinations thereof preferably said actuator defining an overall cylindrical shape having circular cross sectional area.

67. The cylindrical nano-drive according to any of the points 54 to 66, wherein said actuator longitudinally and transversely contracting and extending providing a longitudinal movement of said movable member by operating said actuator electrically, magnetically, mechanically, hydraulically or pneumatically or any combinations thereof, preferably by operating said actuator electrically.

68. The cylindrical nano-drive according to any of the points 54 to 67, wherein said actuator is construed from piezoelectric materials such as quartz.

69. The cylindrical nano-drive according to any of the points 54 to 68, wherein said actuator further comprising electrodes mounted onto inner and/or outer surfaces of said actuator for operation of said actuator to longitudinally and transversely contraction and extension by applying electrical signals to said electrodes.

70. The cylindrical nano-drive according to point 69, wherein said electrical signals are constituted by DC signals and/or AC signals such as alternating square wave signals, alternating triangularly shaped signals or sinusoidal signals or any combinations thereof.

71. The cylindrical nano-drive according to any of the points 54 to 70, wherein said supporting body defining said inner cylindrical space further defines a tapered extension space section co-axially placed and communicating with said inner cylindrical space and tapering toward said first longitudinal axis leaving reduced access through an aperture to said inner cylindrical space thereby constituting a micro-pipette.

72. The cylindrical nano-drive according to any of the points 54 to 71, wherein said supporting body defining said inner cylindrical space in communication with an inner space comprising at least two apertures, said movable member movable into said inner space controlling passage between said at least two apertures thereby constituting a micro-valve.

73. The cylindrical nano-drive according to any of the points 54 to 72, wherein said cylindrical nano-drive further comprising a second inertial body defining a distal end and a seventh proximal end and a second actuator defining a fifth proximal end, a sixth proximal end and a fourth longitudinal axis, said fifth proximal end of said second actuator being connected to said seventh proximal end of said second inertial body and said fifth proximal end of said second actuator being connected to said second mounting surface of said movable member, said fourth longitudinal axis of said second actuator being substantially parallel to said first longitudinal axis of said open ended cylindrical space so as to provide a substantially continuous motion of said movable member.

74. A multi-point testing apparatus for testing electric properties on a specific location of a test sample, comprising:
    means for receiving and supporting said test sample;
    electric properties testing means including electric generator means for generating a test signal and electric measuring means for detecting a measuring signal;
    a multi-point probe, comprising:
    a supporting body;
    a first multitude of conductive probe arms positioned in co-planar relationship with a surface of said supporting body, and freely extending from said supporting body, giving individually flexible motion of said first multitude of conductive probe arms; and
    said conducting probe arms originating from a process of producing said multi-point probe including producing said conductive probe arms on supporting wafer body in facial contact with said supporting wafer body and removal of a part of said wafer body providing said supporting body and providing said conductive probe arms freely extending from said supporting body;
    said multi-point probe communicating with said electric properties testing means; and
    nano driving means for reciprocating said multi-point probe relative said test sample so as to cause said conductive probe arms to be contacted with said specific location of said test sample for performing said testing of electric properties thereof.

75. The multi-point testing apparatus according to point 74, wherein said nano-driving means comprises the features according to points 54 to 73.

76. The multi-point testing apparatus according to point 74 or 75, wherein said multi-point probe comprises the features according to points 2 to 48.

77. The multi-point testing apparatus according to any of the points 74 to 76, wherein said electric properties testing means further comprising means for electric properties probing of said test sample.

78. The multi-point testing apparatus according to points 74 and 77, wherein said reciprocating means further comprises holding means for said means for said multi-point probe.

79. The multi-point testing apparatus according to points 74 to 78, further comprising means for positioning said holding means across said test sample and recording of a location of said holding means relative to said test sample.

80. The multi-point testing apparatus according to points 74 to 79, wherein said means for positioning comprising maneuverability in all spatial directions, being directions co-planar to said test sample and directions perpendicular to said test sample.

81. The multi-point testing apparatus according to points 74 to 80, wherein said means for positioning further comprising means for angular movement of said holding means, such as to provide angular positions for said means for said multi-point probe.

82. The multi-point testing apparatus according to points 74 to 81, wherein said means for positioning further comprising means for angular movement of said holding means along an axis parallel to surface of said test sample, such as to provide angular positions for said means for said multi-point probe.

83. The multi-point testing apparatus according to points 74 to 82, wherein said means for positioning further comprising means for angular movement of said holding means along an axis perpendicular to surface of said test sample, such as to provide angular positions for said means for said multi-point probe.

84. The multi-point testing apparatus according to points 74 to 83, wherein said means for positioning further comprising means for sensing contact between said test sample and said means for said multi-point probe.

The invention claimed is:

1. A multi-point probe for testing electric properties on a specific location of a test sample in a fixed position, comprising:
    a supporting body having a top surface;
    a plurality of probe arms disposed in co-planar relationship with the top surface and extending across the top surface, each probe arm including an electrically conducting layer;
    a plurality of active guarding electrodes disposed on the top surface between the probe arms; and
    a plurality of insulating spacings disposed between the active guarding electrodes and the probe arms;
    wherein each probe arm has a fixed end and a free end;
    wherein the fixed end of each probe arm connects to the supporting body;
    wherein the free ends of the plurality of probe arms extend in a direction away from a single edge of the supporting body; and
    wherein the multi-point probe is movable relative to the test sample.

2. The multi-point probe of claim 1, further comprising:
    a plurality of conductive tip elements extending from the free ends of the probe arms.

3. The multi-point probe of claim 2, wherein the conductive tip elements have a separation between 1 nm and 100 nm.

4. A multi-point probe for testing electric properties on a specific location of a test sample in a fixed position, comprising:
    a supporting body having a top surface;
    a plurality of conductive arms disposed in co-planar relationship with the top surface and extending across the top surface each probe arm including an electrically conducting layer;

a plurality of active guarding electrodes disposed on the top surface between the probe arms; and a plurality of insulating spacings disposed between the active guarding electrodes and the probe arms;

wherein each probe arm has a fixed end and a free end;

wherein the fixed end of each probe arm connects to the supporting body; and wherein the free end of each probe arm extends from the supporting body.

5. The multi-point probe of claim 4, further comprising:

a plurality of conductive tip elements extending from the free ends of the probe arms.

6. The multi-point probe of claim 5, wherein the conductive tip elements have a separation between 1 1nm and 100 nm.

* * * * *